United States Patent [19]
Itoh et al.

[11] Patent Number: 5,086,015
[45] Date of Patent: Feb. 4, 1992

[54] METHOD OF ETCHING A SEMICONDUCTOR DEVICE BY AN ION BEAM

[75] Inventors: Fumikazu Itoh, Fujisawa; Akira Shimase; Satoshi Haraichi, both of Yokohama; Takahiko Takahashi, Iruma; Mikio Hongo, Yokohama, all of Japan

[73] Assignee: Hitachi, Ltd., Tokyo, Japan

[21] Appl. No.: 394,364

[22] Filed: Aug. 15, 1989

[30] Foreign Application Priority Data

Aug. 24, 1988 [JP] Japan .................................. 63-208374

[51] Int. Cl.⁵ ............................................ H01L 21/26
[52] U.S. Cl. .................................... 437/173; 437/225; 148/DIG. 46; 156/643; 250/492.2; 250/492.3; 219/121.2; 219/121.26
[58] Field of Search ............... 148/DIG. 46; 156/643; 250/492.2; 437/173, 225

[56] References Cited

U.S. PATENT DOCUMENTS

| | | | |
|---|---|---|---|
| 4,639,301 | 1/1987 | Doherty et al. | 156/643 |
| 4,698,129 | 10/1987 | Puretz et al. | 156/643 |
| 4,868,068 | 9/1989 | Yamaguchi et al. | 428/596 |
| 4,874,460 | 10/1989 | Nakagawa et al. | 156/643 |
| 4,874,947 | 10/1989 | Ward et al. | 250/492.2 |
| 4,900,695 | 2/1990 | Takahashi | 437/195 |

Primary Examiner—Brian E. Hearn
Assistant Examiner—Laura M. Holtzman
Attorney, Agent, or Firm—Fay, Sharpe, Beall, Fagan, Minnich & McKee

[57] ABSTRACT

A method of etching a semiconductor device having multi-layered wiring by an ion beam is disclosed which method comprises the steps of: extracting a high-intensity ion beam from a high-density ion source; focusing the extracted ion beam; causing the focused ion beam to perform a scanning operation by a voltage applied to a deflection electrode; forming a first hole in the semiconductor device by the focused ion beam to a depth capable of reaching an insulating film formed between upper and lower wiring conductors so that the first hole has a curved bottom corresponding to the undulation of the upper wiring conductor, and the upper wiring conductor is absent at the bottom of the first hole; and scanning a portion of the bottom of the first hole with the focused ion beam to form a second hole in the insulating film to a depth capable of reaching the lower wiring conductor, thereby preventing the shorting between the upper and lower wiring conductors. Further, a method of forming a hole of a predetermined shape at a surface area having a step-like portion of a semiconductor device by an ion beam is disclosed which method comprises a pre-etching step of scanning the high-level region of the step-like portion with the ion beam so that the high-level region becomes equal in level to the low-level region of the step-like portion, and a main step of scanning the whole of the surface area with the ion beam till the hole of the predetermined shape is formed in the semiconductor device.

10 Claims, 27 Drawing Sheets

FIG. 8A
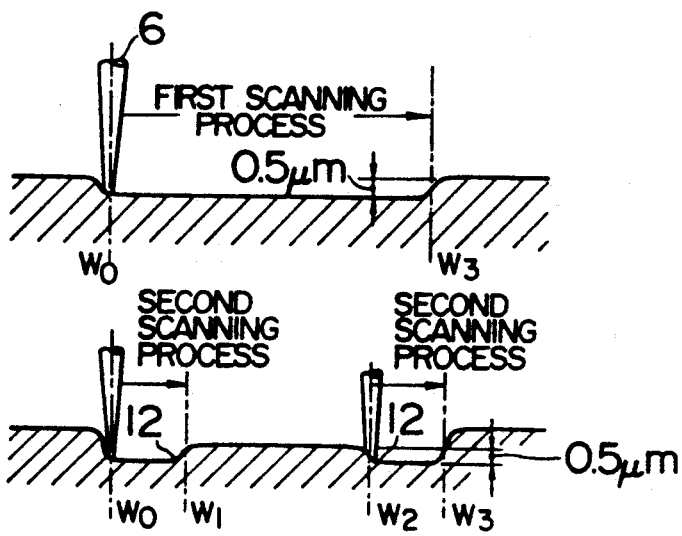
FIG. 8B
FIG. 8C
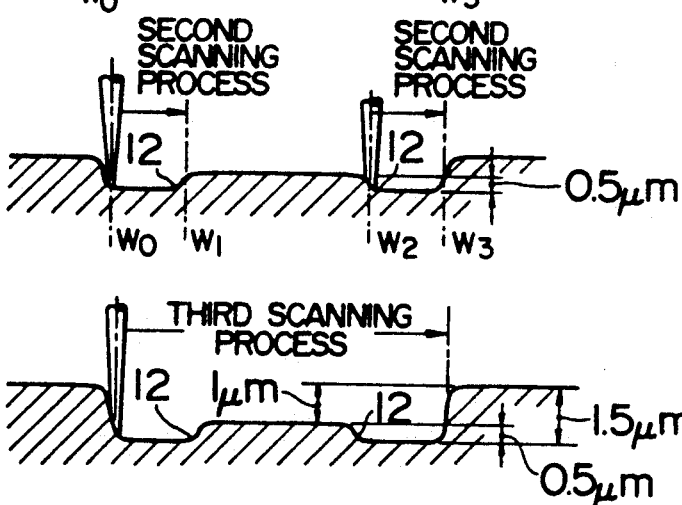
FIG. 8D
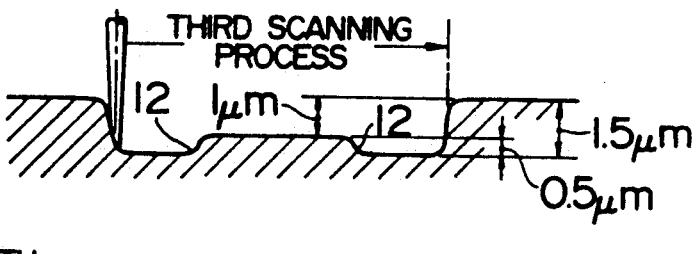
FIG. 8E
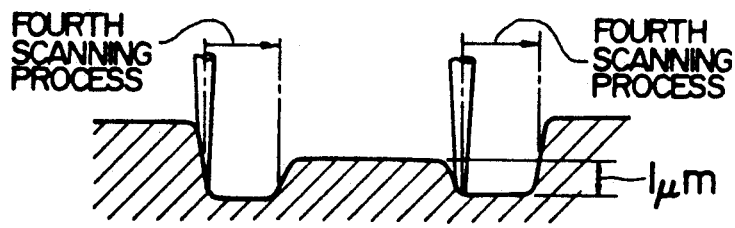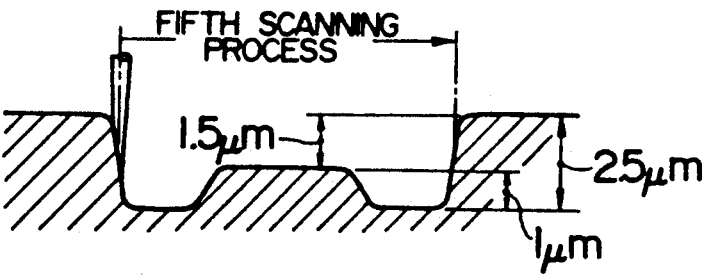
FIG. 8F
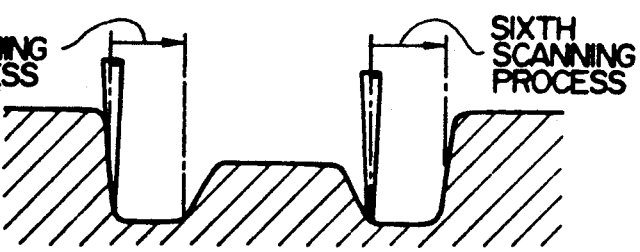

FIG. 9
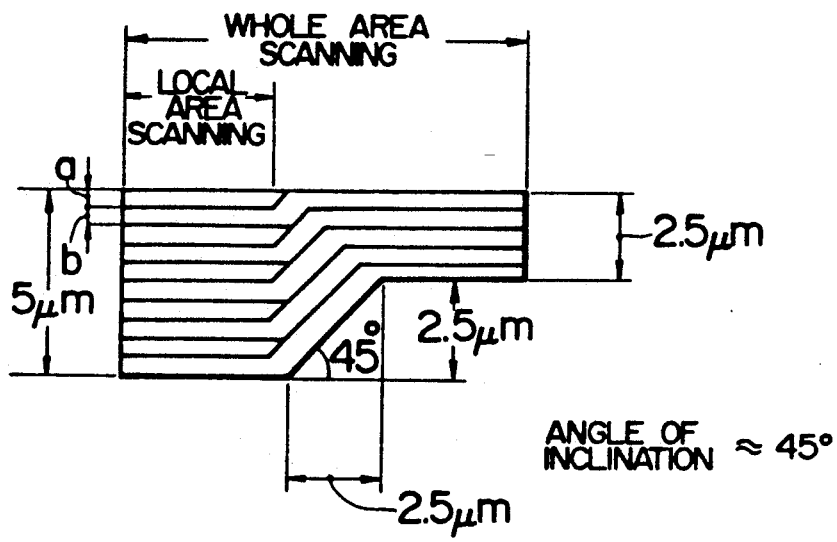
ANGLE OF INCLINATION ≈ 45°
FIG. 10 (ETCHING DEPTH RATIO a:b = 2:1)
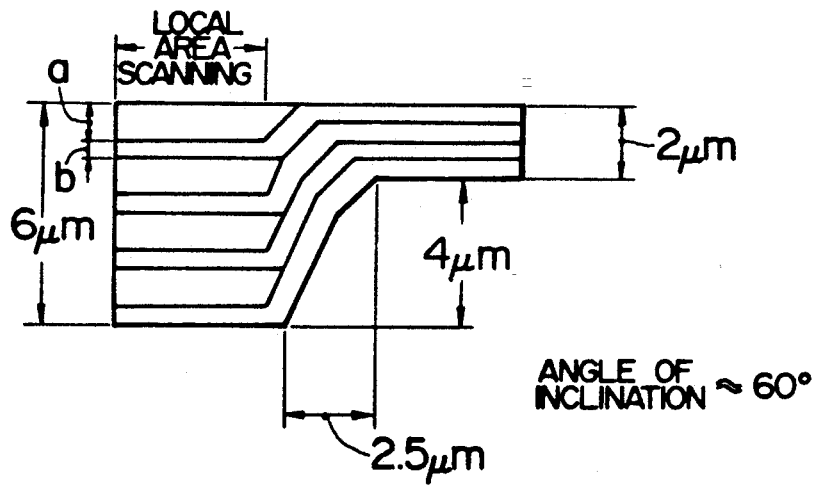
ANGLE OF INCLINATION ≈ 60°
FIG. 11
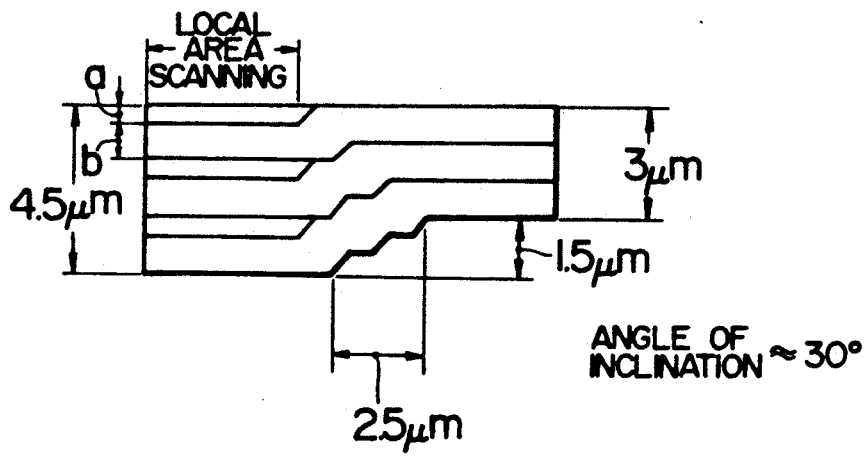
ANGLE OF INCLINATION ≈ 30°

FIG. 12A
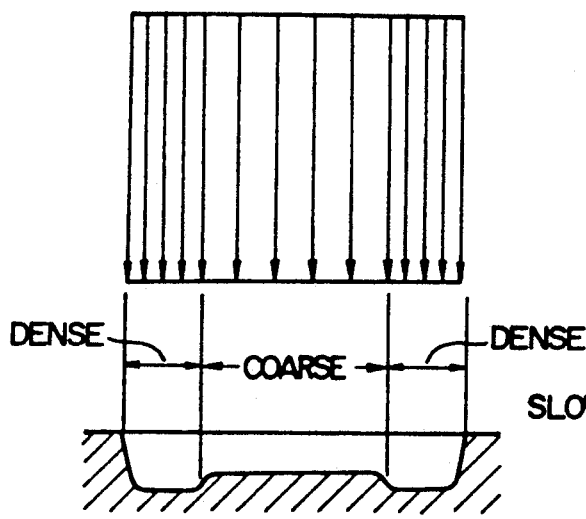
FIG. 12B
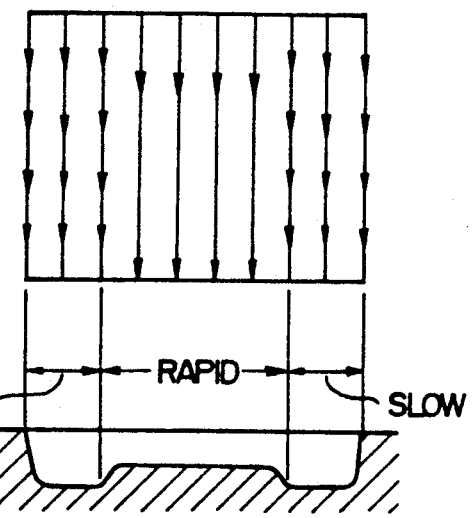
FIG. 13A
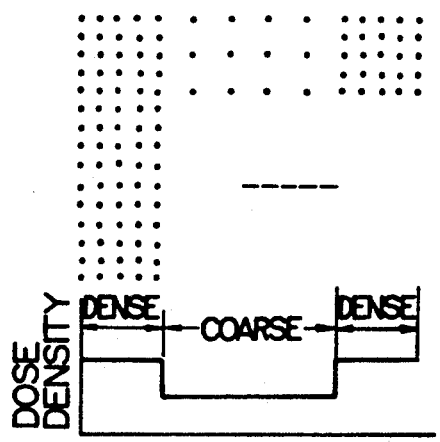
FIG. 13B
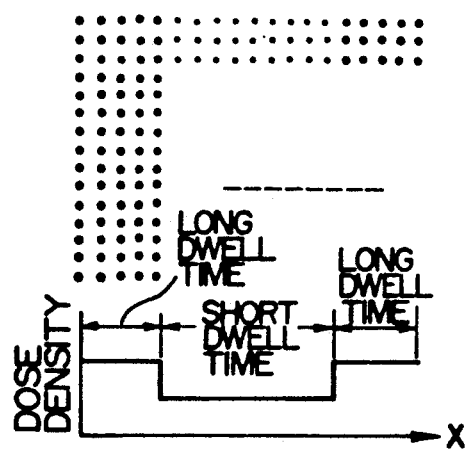

FIG. 14
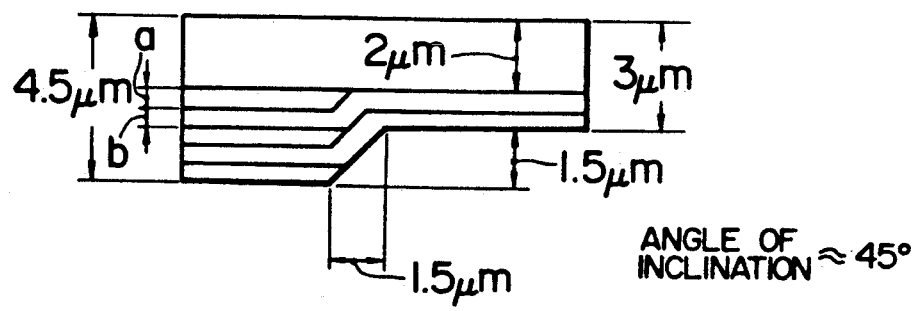
FIG. 15
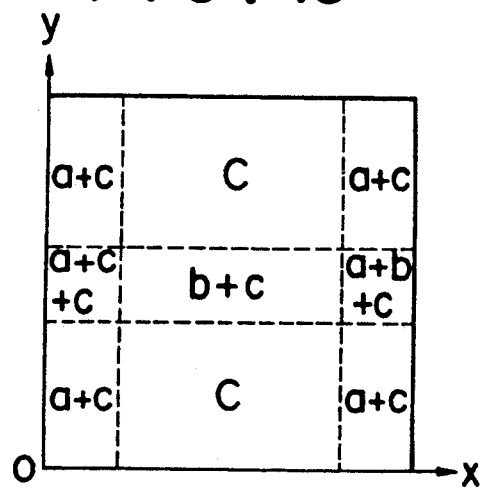
FIG. 16A    FIG. 16B    FIG. 16C
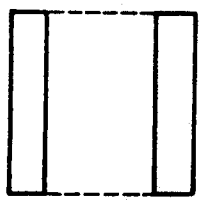 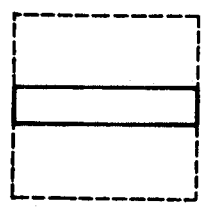 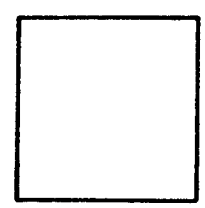
FIG. 17
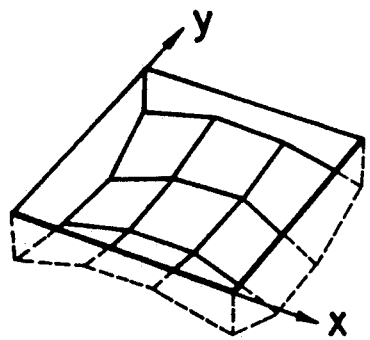

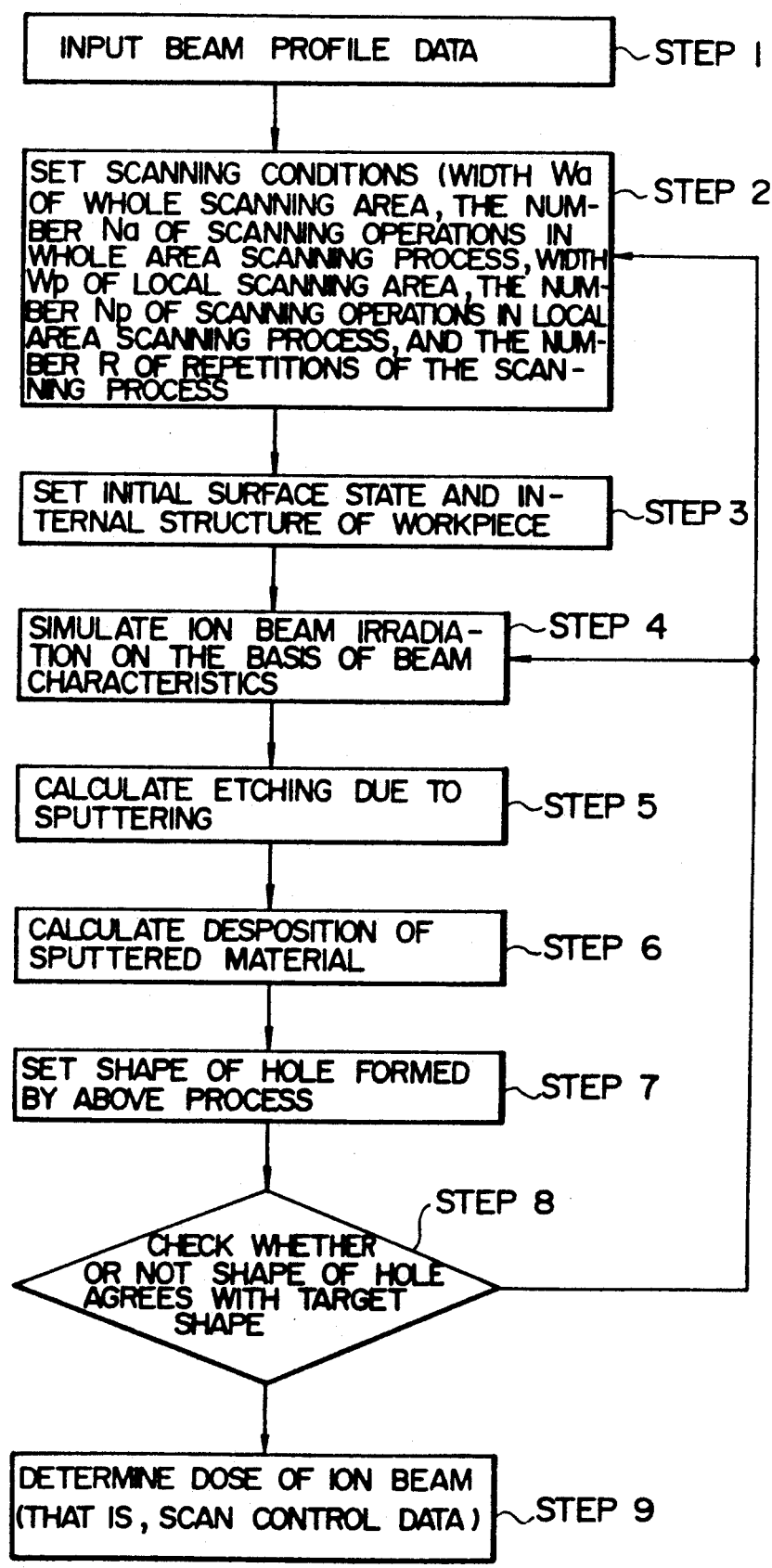

FIG. 25A
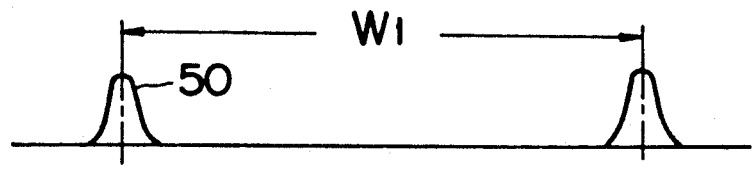
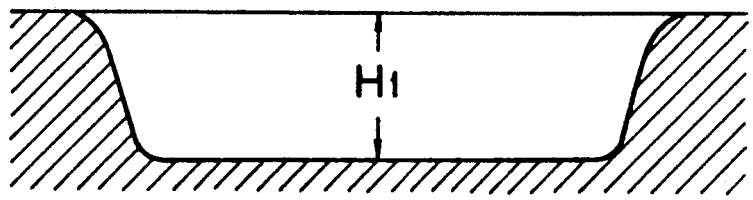
FIG. 25B
FIG. 25C
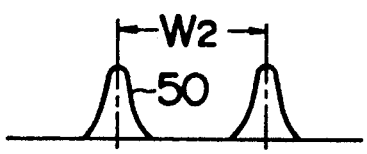
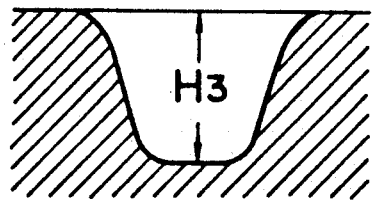
FIG. 25D
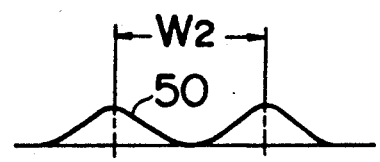
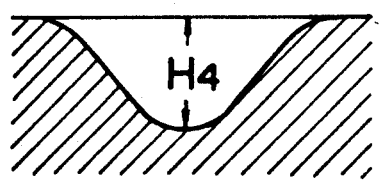

|—5μm—|

F I G. 36A
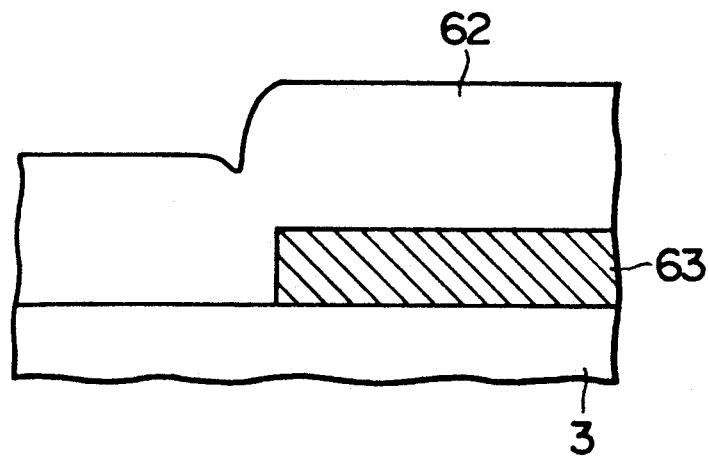
F I G. 36B
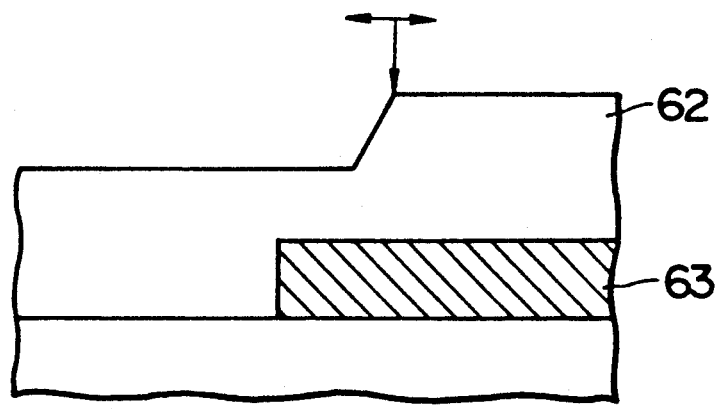

METHOD OF ETCHING A SEMICONDUCTOR DEVICE BY AN ION BEAM

BACKGROUND OF THE INVENTION

The present invention relates to an ion beam etching method and an ion beam etching apparatus, and more particularly to a method of and an apparatus for etching semiconductor devices such a very large scale integration circuit by a ion beam.

An ion beam etching apparatus is disclosed in U.S. Pat. Nos. 4,503,329, 4,609,809 and 4,683,378. That is, the ion beam etching apparatus is used as a mask repair apparatus or wafer repair apparatus. According to an ordinary ion beam etching method, an ion beam performs a scanning operation at a rectangular area, to etch a region having the form of a rectangular parallel piped. Further, an example of two-stage ion beam etching is shown in FIG. 1 of an article entitled "Focused Ion Beam Microsurgery for Electronics" by C. R. Musil (IEEE ELECTRON DEVICE LETTERS EDL7, 5, MAY, 1986). In this example, upper and lower wiring conductors are connected to each other by a focused ion beam. That is, the above example has no connection with means for preventing the shorting between the upper and lower wiring conductors due to ion beam etching.

According to the conventional ion beam etching method, when a hole is made in a semiconductor device by an ion beam to expose a lower wiring conductor, there is a fear that the lower wiring conductor is shorted to an upper wiring conductor, and thus the manufacturing yield in wiring process is reduced.

Further, an example, of the etching of a large scale integration circuit by a focused ion beam is described on pages 176 through 180 of the J. Vac. Sci. Techno., B4 (1), Jan/Feb, 1989. As shown in this example, when a specimen surface having a step-like portion is etched by a focused ion beam, the etching operation is affected by the step-like portion, and the bottom of a hole made by the ion beam etching is inclined or has unevenness. The inclination and unevenness of the bottom reduce the margin of etching depth, and lower the manufacturing yield in etching process.

SUMMARY OF THE INVENTION

It is a first object of the present invention to provide a method of and an apparatus for etching a semiconductor device by an ion beam which method and apparatus can form a hole in the semiconductor device by the ion beam so that the bottom of the hole has a gently-sloping step-like portion, to prevent the shorting between upper and lower wiring conductors.

It is a second object of the present invention to provide a method of and an apparatus for etching a semiconductor device by an ion beam which method and apparatus can bore a hole into the semiconductor device from a surface area having a step-like portion by the ion beam so that the hole has a flat bottom, to make the margin of etching depth equal to the margin of etching depth in a case where the hole is bored from a flat surface area, thereby improving the manufacturing yield in hole boring process.

In order to attain the first object, according to an aspect of the present invention, there is provided a method of etching a semiconductor device having multi-layered wiring by an ion beam which method comprises the steps of: extracting a high-intensity ion beam from a high-density ion source; focusing the extracted ion beam; causing the focused ion beam to perform a scanning operation by a voltage applied to a deflection electrode; forming a first hole in the semiconductor device to a depth capable of reaching an insulating film formed between upper and lower wiring conductors so that the first hole has a curved bottom corresponding to the undulation of the upper wiring conductor, and the upper wiring conductor is absent at the bottom of the first hole; and scanning a portion of the bottom of the first hole with the focused ion beam, to form a second hole in the insulating film to a depth capable of reaching the lower wiring conductor, thereby preventing the shorting between the upper and lower wiring conductors.

In the above method of etching a semiconductor device by an ion beam, the first hole with the curved bottom corresponding to the undulation of the upper wiring conductor is formed in such a manner that the dose of the focused ion beam performing the scanning operation is locally varied.

Alternatively, the first hole with the curved bottom corresponding to the undulation of the upper wiring conductor is formed in such a manner that one of the scanning density and scanning speed of the focused ion beam is locally varied.

Further, in order to attain the first object, according to another aspect of the present invention, there is provided an apparatus for etching a semiconductor device having multi-layered wiring by an ion beam which apparatus comprises: high-density ion source; an extracting electrode for extracting a high-intensity ion beam from the high-density ion source; an electrostatic lens for focusing the extracted ion beam; a deflection electrode for deflecting the focused ion beam; calculation means for determining a target shape of first hole with a curved bottom corresponding to the undulation of an upper wiring conductor, and for calculating deflection data indicative of a voltage applied to the deflection electrode, on the basis of data for shape calculation so that the shape of the first hole becomes equal to the target shape; and control means for controlling the deflection of the focused ion beam on the basis of the deflection data from the calculation means, to form the first hole in the semiconductor device to a depth capable of reaching an insulating film formed between the upper wiring conductor and a lower wiring conductor so that the upper wiring conductor is absent at the bottom of the first hole, and to scan a portion of the bottom of the first hole with the focused ion beam so that a second hole reaching the lower wiring conductor is formed in the insulating film, thereby preventing the shorting between the upper and lower wiring conductors.

The data for shape calculation used in the above apparatus includes data on sputtering rate, data for calculating the deposition of sputtered material, and data indicative of the characteristics of the focused ion beam.

Further, according to a further aspect of the present invention, there is provided an apparatus for etching a semiconductor device by an ion beam which apparatus comprises: a high-density ion source; an extracting electrode for extracting a high-intensity ion beam from the high-density ion source; an electrostatic lens for focusing the extracted ion beam; a deflection electrode for deflecting the focused ion beam; calculation means for determining the target shape of a hole whose bottom has a step-like portion, and for calculating deflection data indicative of a voltage applied to the deflection electrode, on the basis of data for shape calculation so that the shape of the hole becomes equal to the target shape; and control means for controlling the deflection of the focused ion beam on the basis of the deflection data from the calculation means, to form the hole in the semiconductor device.

The data for shape calculation used in the above apparatus includes data on sputtering rate, data for calculating the deposition of sputtered material and data indicative of the characteristics of the focused ion beam.

In order to attain the second object, according to still another aspect of the present invention, there is provided a method of forming a hole of a predetermined shape at a surface area having a step-like portion of a semiconductor device by an ion beam which method comprises a pre-etching step of scanning only the high-level region of the step-like portion with the ion beam so that the high-level region becomes substantially equal in level to the low-level region of the step-like portion, and a main step of scanning the whole of the surface area with the ion beam till the hole of the predetermined shape is formed in the semiconductor device.

According to the above method, an upper wiring conductor which is included in a semiconductor device having a step-like portion, can be cut or removed, without damaging a lower wiring conductor. In more detail, when a hole is formed in the semiconductor device by the ion beam to cut or remove the upper wiring conductor, the bottom of the hole can be made flat, and the flat bottom can be placed in a thin insulating film formed between the upper and lower wiring conductors. Thus, the upper wiring conductor can be cut or removed without damaging the lower wiring conductor.

When the high-level region of the step-like portion is etched by the ion beam, the position of the high-level region is determined on the basis of positional information due to the design data of the semiconductor device and information on a manufacturing process for making the semiconductor device.

Alternatively, the position of the high-level region is determined on the basis of positional information due to the design data of the semiconductor device and positional information at the surface area obtained by detecting secondary particles which are emitted from the surface area at a time the surface area is bombarded with the ion beam.

Further, according to a still further aspect of the present invention, there is provided an apparatus for etching a workpiece by an ion beam which apparatus comprises position detection means for determining the position of a surface area to be etched, the position detection means including secondary particle detection means having at least a pair of split detection plates placed on the same plane, an image processor for processing video signals which are detected by the detection plates and indicate the state of the to-be-etched surface area, and display means for displaying the output signal of the image processor.

According to the above apparatus, even when the surface area has a step-like portion the position of the step-like portion can be accurately detected by the position detection means. Then, before the whole of the to-be-etched area is scanned with the ion beam after only the higher level region is scanned with the ion beam so that the step-like portion disappears and a hole having a flat bottom can be formed, since the sputtering rate at the step-like portion is higher than that at the flat portion.

BRIEF DESCRIPTION OF THE DRAWINGS

FIGS. 8A to 8F are sectional views which show changes in cross section of a surface area caused by repeating a scanning operation for a local area and a scanning operation for the whole of a predetermined area.

FIGS. 9 to 11 are schematic diagrams showing a fact that in a case where the scanning of a local area with a focused ion beam and the scanning of the whole area with the focused ion beam are alternately and repeatedly carried out, changes in cross section of a surface area depend upon a ratio of the etching depth due to the local area scanning to the etching depth due to the whole area scanning.

FIG. 12A shows that a hole having a desired shape can be formed by scanning a predetermined area repeatedly with a focused ion beam in such a manner that a scanning density is locally varied.

FIG. 12B shows that a hole having a desired shape can be formed by scanning a predetermined area repeatedly with a focused ion beam in such a manner that a scanning speed is locally varied.

FIGS. 13A and 13B show that a hole having a desired shape can be formed by scanning a predetermined area repeatedly with an ion beam in such a manner that the dose of the ion beam is locally varied.

FIG. 14 shows the cross section of a hole which is formed in such a manner that after the whole of a predetermined area has been scanned with an ion beam so that the whole area is etched to a desired depth, the scanning operation for a local area and the scanning operation for the whole area are alternately and repeatedly performed.

FIG. 15 shows that a surface to be etched by an ion beam is divided into a plurality of parts, ad the parts are not necessarily equal in dose of ion beam to each other.

FIGS. 16A and 16B show local areas which are to be scanned with an ion beam.

FIG. 16C shows the whole of a predetermined area which is to be scanned with an ion beam.

FIG. 17 is a schematic diagram showing a hole which is formed by repeating the scanning operations for the local areas of FIGS. 16A and 16B and the scanning operation for the whole area of FIG. 16C.

FIG. 18 is a flow chart which shows the processing carried out by the processor 34 of FIG. 7 for obtaining scan control data.

FIGS. 25A to 25D show that an etching depth is dependent upon an ion beam profile and a scanning area.

FIG. 36A is a diagram showing a difference in level which appears when a passivation film is formed on a wiring conductor by the chemical vapor deposition method.

FIG. 36B is a diagram showing a difference in level which appears when a passivation film is formed on a wiring conductor by the sputtering method.

DESCRIPTION OF THE PREFERRED EMBODIMENTS

Figure 1:
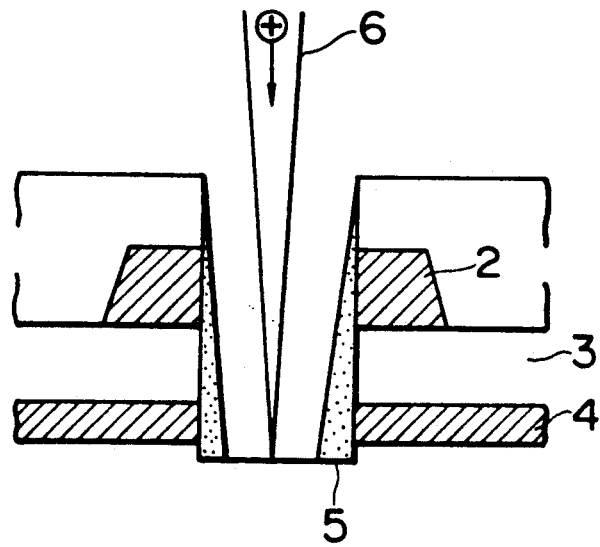
FIG. 1 is a schematic diagram showing the shorting between upper and lower wiring conductors due to the deposition of a sputtered material in a case where a single hole is formed in a semiconductor device having multi-layered wiring by a focused ion beam.

The principle of the present invention will first be explained, with reference to the drawings. Referring to FIG. 1, in a case where a hole is made in a semiconductor device such as a very large scale integration circuit by a focused ion beam and the hole penetrates an upper conductor 2 of multi-layered wiring to cut a lower conductor 4, there arises a problem that the upper wiring conductor 2 is shorted to the lower wiring conductor 4 by a deposition layer 5 made of a sputtered material.

Figure 2A:
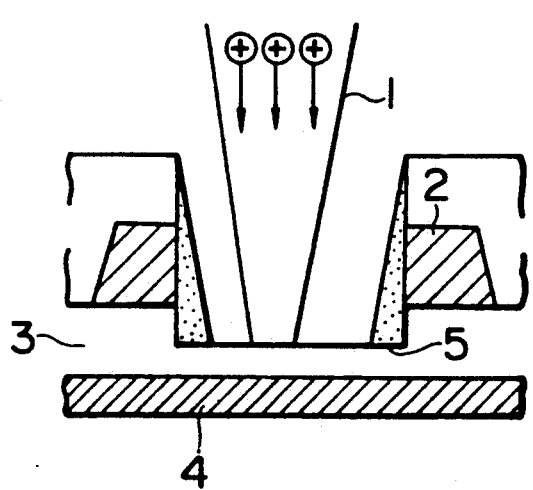
FIG. 2A shows a state that a large hole is formed in a semiconductor device having multi-layered wiring by bombarding the semiconductor device with a large-current ion beam, and thus part of an upper wiring conductor is removed.
Figure 2B:
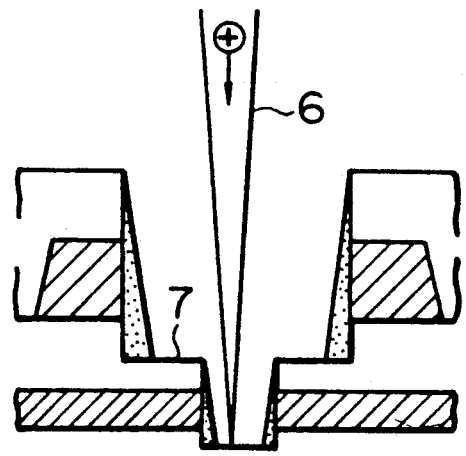
FIG. 2B shows a state that a small hole is formed in the semiconductor device by bombarding a portion of the bottom of the large hole with a small-current ion beam and thus part of a lower wiring conductor is removed.
Figure 3A:
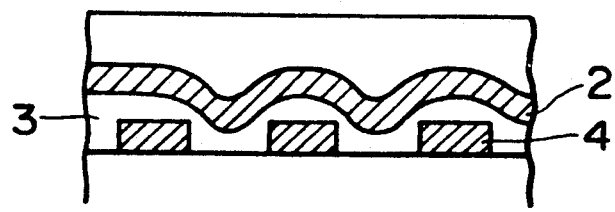
FIGS. 3A, 3B and 3C are schematic diagrams for explaining a fact that, in a case where the upper wiring conductor of a semiconductor device having multi-layered wiring has undulation, the upper wiring electrode is shorted to a lower wiring conductor even when large and small holes are made in the semiconductor device by an ion beam as shown in FIGS. 2A and 2B.
Figure 3B:
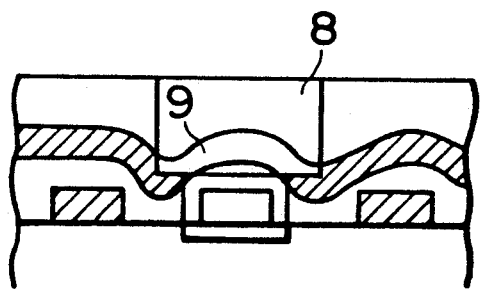
Figure 3C:
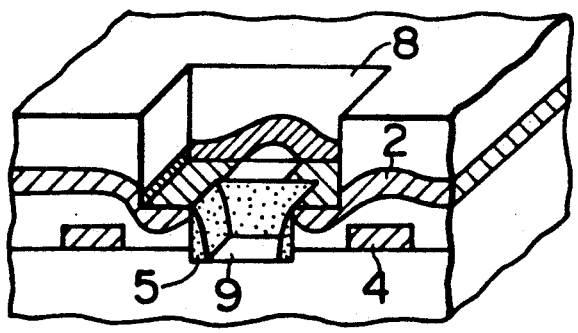

In order to solve this problem, a method is devised, in which large and small holes are formed in a semiconductor device as shown in FIGS. 2A and 2B. In a case where each of the upper and lower wiring conductors 2 and 4 is flat as shown in FIG. 1, when two holes are formed as shown in FIG. 2B, the upper wiring electrode 2 can be electrically insulated from the lower wiring conductor 4 by an insulating film 3. However, in a case where the upper wiring conductor 2 has undulation based upon the presence of the lower wiring pattern 4 as shown in FIG. 3A, when a large hole 8 is made in the semiconductor device as shown in FIG. 3B, the upper wiring conductor 2 remains at the bottom of the hole 8. Accordingly, when a small hole 9 is made as shown in FIG. 3C, the upper wiring conductor 2 is shorted to the lower wiring conductor 4 by the deposition layer 5. Thus, the manufacturing yield in the lower-conductor cutting process is reduced.

Figure 4:
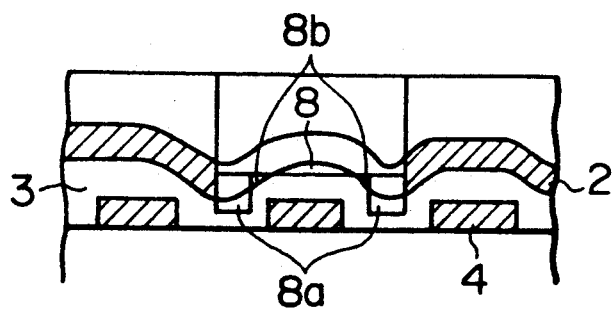
FIG. 4 shows that, in a case where the upper wiring conductor of a semiconductor device having multi-layered wiring has undulation, even when a peripheral portion of the bottom of a large hole is further dug by an ion beam, the upper wiring conductor is present at the bottom of the hole.

In order to solve this problem it is necessary for the bottom of the hole 8 to have a step-like portion corresponding to the undulation of the upper wiring conductor 2. Referring to FIG. 4, after the hole 8 has been made, additional recesses 8a are formed at those end portions of the bottom of the hole 8 where the upper wiring conductor 2 remains. In a case where the upper wiring conductor 2 has small undulation, the whole bottom of the hole 8 and additional recesses 8a is formed in the insulating film 5. In a case where the upper wiring conductor 2 has large undulation, however, a portion 8b of the upper wiring conductor 2 remains at the bottom of the hole 2, as shown in FIG. 4.

In addition to the cutting of the lower wiring conductor, it is required to remove a large area of an upper wiring pattern by a focused ion beam for the purpose of observing a lower wiring pattern by an optical microscope. In this case, also, the upper wiring pattern has undulation based upon the lower wiring pattern. In order to remove the above area of the upper wiring pattern completely, it is necessary to form a hole which has a bottom corresponding to the undulation of the upper wiring pattern.

Figure 5A:
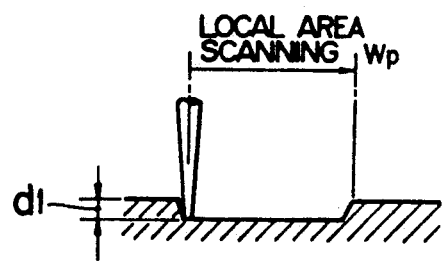
FIG. 5A shows a state that a local area is etched by scanning the local area with a focused ion beam.
Figure 5B:
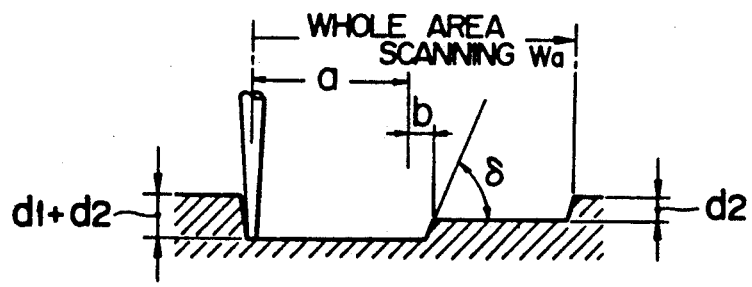
FIG. 5B shows that when the whole of a desired area is scanned with a focused ion beam after the local area of FIG. 5A has been scanned with the focused ion beam, a region having a difference in level is moved.
Figure 6:
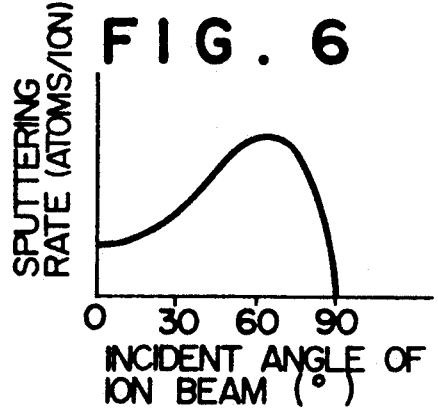
FIG. 6 is a graph showing a relationship between the angle of incidence of ion beam and the sputtering rate.

According to the present invention, a hole is formed in a semiconductor device in the following manner. Referring to FIG. 5A, a partial scanning is applied to a local area a on a predetermined area by using an ion beam to etch the local area to a depth $d_1$, and then the whole of the predetermined area is scanned with the ion beam to etch the whole area by a depth $d_2$. In this case, a step-like portion is generated by the partial scanning operation for the local area (namely, local area scanning), and the step-like portion is moved by b to the right by the scanning operation for the whole area (namely, whole area scanning), as shown in FIG. 5b. This is because a sputtering rate at a horizontal plane having an incident angle of 0° is far smaller than a sputtering rate at an inclined plane, as shown in FIG. 6.

The movement of the step-like portion is proportional to the etching depth $d_2$ due to the whole area scanning. When the local area scanning and the whole area scanning ar alternately and repeatedly carried out, the difference in level at the step-like portion is equal to the product of the etching depth $d_1$ due to the local area scanning and the number of repetitions, and the inclination $\delta$ of the step-like portion is determined by a ratio of the etching depth $d_1$ to the etching depth $d_2$, and a relationship between the spattering rate and the ion incident angle onto the etched material. That is, according to the present invention, a hole which has a bottom corresponding to the undulation of the upper wiring conductor or the like, can be formed by the ion beam. Thus, the above-mentioned shorting between the upper and lower wiring conductors can be prevented, and the manufacturing yield in the wiring process of large scale integration circuit can be improved.

Figure 7:
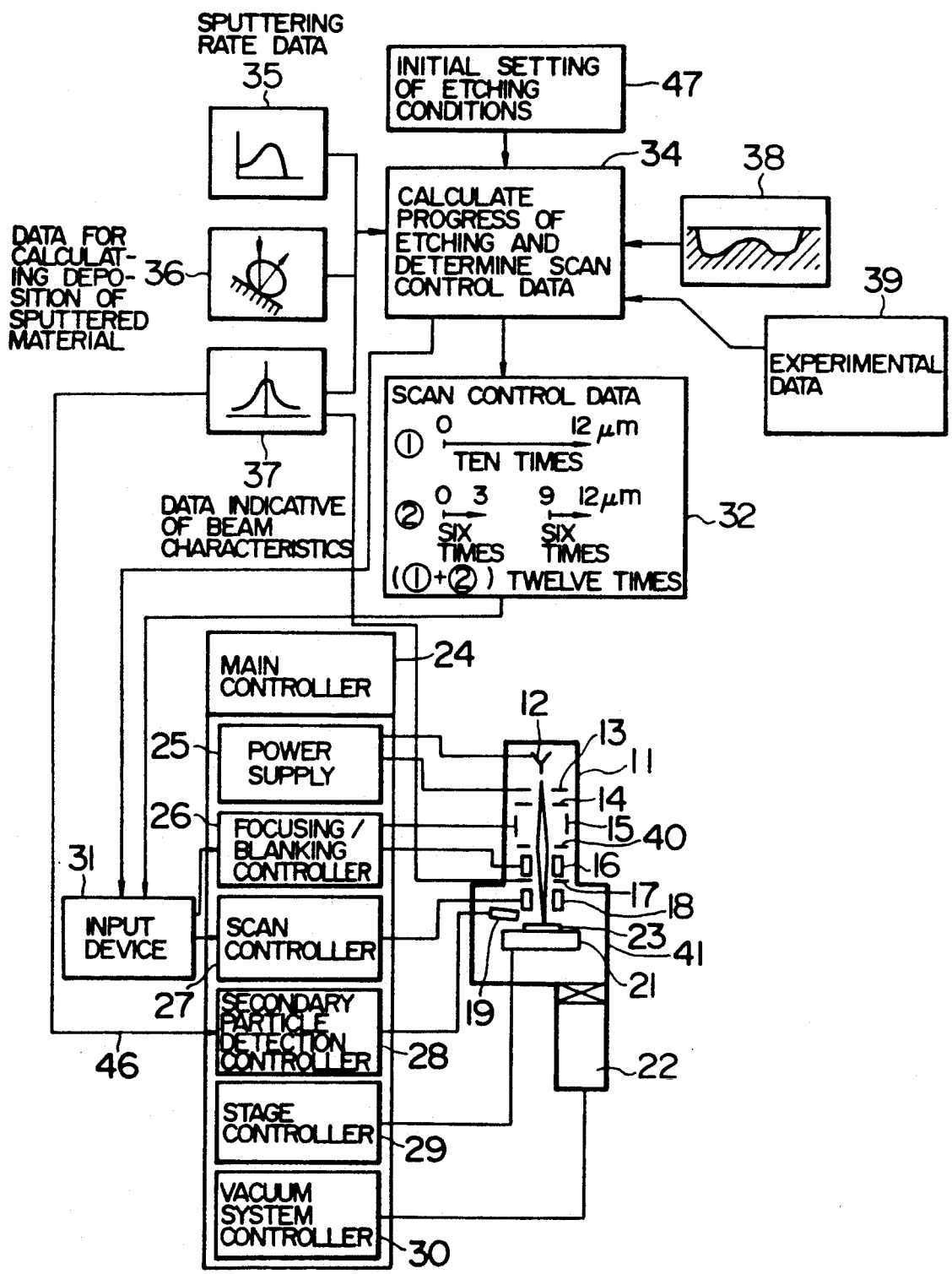
FIG. 7 is a diagram, partly in block and partly schematic, of an embodiment of an apparatus for etching a semiconductor device by an ion beam in accordance with the present invention.

Next, explanation will be made of an embodiment of a method of etching a semiconductor device by a focused ion beam in accordance with the present invention, with reference to FIGS. 7 to 27. FIG. 7 shows main parts of an apparatus for etching a semiconductor device by a focused ion beam in accordance with the present invention. In an ion beam etching apparatus, the shape of a hole or recess which is made by scanning a workpiece with a focused ion beam, is dependent upon the etching characteristics of the workpiece, the diameter and profile of the focused ion beam, and other factors. Accordingly, in order to form a hole or recess having a desired shape, it is necessary to supply scan control data which is produced from experimental results or by simulation, to the ion beam etching apparatus.

Referring to FIG. 7 which shows an ion beam etching apparatus according to the present invention, a processor 34 produces scan control data 32. For example, the scan control data 32 indicates, as shown in FIGS. 8A to 8D, a first scanning process in which the etching of the material is repeated 10 times on an area from $w_o = 0$ μm to $w_3 = 12$ μm, a second scanning process in which the etching is repeated six times on left and right parts of the area, i.e. from $w_o = 0$ μm to $w_1 = 3$ μm and from $w_2 = 9$ μm to $w_3 = 12$ μm and further scanning processes similar to the first and second scanning processes, respectively, are repeated as the third, fourth, fifth, sixth . . . processes, for example, twelve times, where $w_1$, $w_2$ and $w_3$ represent the distances measured from $w_o = 0$ μm.

As shown in FIG. 7, the ion beam etching apparatus has a focused ion beam chamber 11. The chamber 11 includes therein a high-density ion source 12 made of a liquid or molten metal, an extracting electrode 13 for extracting a high-intensity ion beam from the ion source 12, an aperture 14 for taking out only a central portion of the high-intensity ion beam, an electrostatic lens (namely, ion optical system) 15 for focusing the taken-out ion beam, an aperture 40 having a variable opening for changing the diameter of the focused ion beam, a blanking electrode 16 and an aperture 17 for blocking the traveling of the focused ion beam, and a deflection electrode 18 for deflecting the focused ion beam so that a semiconductor device (that is, specimen) 23 is scanned with the focused ion beam. Further, a secondary particle detector 19 is disposed in the vicinity of the semiconductor device 23 to detect secondary particles emitted from the semiconductor device 23. A stage 21 for mounting the semiconductor device 23 thereon is made movable in X- and Y-directions. A vacuum system 22 is provided to evacuate a specimen chamber 41 having the stage 21 therein. While, a main controller 24 includes a power supply 25 for the ion source 12 and extracting electrode 13, a focusing/blanking controller 26 for controlling the ion optical system 15 and blanking electrode 16, a scan controller 27 for controlling the deflection electrode 18, a secondary particle detection controller 28 for displaying the output signal of the secondary particle detector 19 on a display screen to observe the unevenness of the surface of the semiconductor device 23, a stage controller 29 for controlling the movement of the stage 21, and a vacuum system controller 30 for controlling the vacuum system 22. The above-mentioned parts of the ion beam etching apparatus are known in the art.

The scan control data 32 which shows the gist of the present invention, is supplied to the scan controller 27 through an input device 31, which is selected from a keyboard, a floppy driver, a cassette tape reader, an interface for data communication, and others.

The scan-control-data producing processor 34 calculates the progress of etching on the basis of data for shape calculation which data includes the sputtering rate data 35, the data 36 for calculating the deposition of sputtered material, and the data 37 indicative of the characteristics of ion beam, and produces the scan control data 32 so that data indicative of a hole made by ion beam etching agrees with the target shape data 38 corresponding to, for example, the undulation of the upper wiring conductor 2 of FIG. 3A. Alternatively, the processor 34 produces the scan control data 32 on the basis of the experimental data 39 indicative of a relation between the inclination of a step-like portion and a ratio of the etching depth a due to the local area scanning to the etching depth b due to the whole area scanning so that data indicative of a hole made by ion beam etching agrees with the target shape data 38 corresponding to, for example, the undulation of the upper wiring conductor 2 of FIG. 3A.

Now, explanation will be made of an example of a hole which is formed by the focused ion beam on the basis of the scan control data 32 produced by the processor 34, with reference to FIGS. 8A to 8F. Referring to FIGS. 8A to 8F, in each of odd-numbered scanning processes, the whole of a predetermined area is scanned with the focused ion beam so that the whole area is etched by a depth of 0.5 μm. While, in each of even-numbered scanning processes, local areas are scanned with the focused ion beam so that the local areas are etched by a depth of 0.5 μm. Step-like portions which are formed on the right and left sides by the second scanning process, are moved by the third scanning process to the left and right, respectively. Thereafter, the same local areas as in the second scanning process are etched by the fourth scanning process. By repeating the whole area scanning and local area scanning, the step-like portion formed by the second scanning process are successively moved to the left or right. As a result, the bottom of the hole thus produced will have a gently-sloping hill.

Next, explanation will be made of a case where only a single step-like portion is formed at the bottom of a hole, with reference to FIGS. 9 to 11. As is apparent from FIGS. 9 top 11, the inclination of the step-like portion varies with a ratio of the etching depth a due to the local area scanning to the etching depth b due to the whole area scanning.

FIG. 9 shows a case where the etching depth a due to the local area scanning and the etching depth b due to the whole area scanning are both made equal to 0.5 μm (that is, a:b=1:1). When the local area scanning and the whole area scanning are alternately and repeatedly carried out, the step-like portion has an angle of inclination of 45°.

FIG. 10 shows a case where a ratio of the etching depth a to the etching depth b is made equal to 2:1. In this case, the angle of inclination of the level difference region is about 60°. That is, the angle of inclination of the level difference region can be increased by increasing the etching depth b due to the local area scanning.

FIG. 11 shows a case where a ratio of the etching depth a to the etching depth b is made equal to 1:2. In this case, the angle of inclination of the level difference region is about 30°. That is, when the etching depth b due to the local area scanning is reduced, the level difference region will have a gentle slope.

FIGS. 9 to 11 show that the level difference region is able to have angles of inclination equal to 45°, 60° and 30°. In fact, the angle of inclination of the level difference region is determined by the dependence of the sputtering rate of a workpiece on the incident angle of the focused ion beam, the dependence of the number of particles sputtered from the workpiece on the sputtering direction, the kinetic energy of the focused ion beam, the current density distribution in the focused ion beam, and the scanning method. Hence, it is preferable to determine the angle of inclination by experiments.

A scanning method for forming the hole of FIG. 14 can be readily obtained by using the processor 34. FIG. 14 shows a case where a hole has a depth of 3 μm and a recess having a depth of 1.5 μm is formed at the bottom of the hole as shown in FIG. 11, but the angle of inclination of the step-like portion is made equal to 45° as shown in FIG. 9. In this case, attention is paid to the fact shown in FIG. 9 (that is, the fact that when a ratio of the etching depth a due to the local area scanning to the etching depth b due to the whole area scanning is made equal to 1:1, the angle of inclination of the step-like portion is 45°). Thus, the whole area is first etched to a depth of 2 μm, and then the local area scanning process for etching the local area by a depth of 0.5 μm and the whole area scanning process for etching the whole area by a depth of 0.5 μm are alternately repeated as shown in FIG. 14, that is, the local area scanning process is repeated three times and the whole area scanning process is repeated two times.

When the whole area is first etched to a desired depth and then the ion beam etching for forming a gently-sloping step-like portion is carried out as mentioned above, a step-like portion having a predetermined depth and a predetermined angle of inclination can be formed at a desired position.

Further, a hole shown in FIG. 17 can be readily formed as mentioned below. A surface to be etched is divided into three parts in each of X- and Y-directions, that is, the surface is divided into nine parts, as shown in FIG. 15, which are bombarded with the focused ion beam so as to have different doses. In a first scanning process, local areas which are indicated by solid lines in FIG. 16A, are scanned with the focused ion beam to etch the local areas to a depth a. Next, in a second scanning process, a local area which is indicated by solid lines in FIG. 16B, is etched to a depth b. Further, in a third scanning process, the whole of an area which is indicated by solid lines in FIG. 16C, is etched to a depth c. When the first, second and third scanning processes are repeated, a level difference region is moved, and thus the bottom of the hole thus formed has the form of a smooth curve. In other words, the hole has a saddle-shaped bottom, as shown in FIG. 17. The inclination of the bottom viewed from each of the X- and Y-directions can be varied by changing the values a, b and c of etching depth.

FIGS. 12A and 12B show other examples of the scan control data 32. In the example of FIG. 9, the local area is scanned with the focused ion beam a plurality of times in the first scanning process to etch the local area by a depth a, and the whole area is scanned with the focused ion beam a plurality of times in the second scanning process to etch the whole area by a depth b. Further, the first scanning process and the second scanning process are alternately repeated to form a desired hole or recess. That is, a large number in repetition of scanning operations are performed in this example. The number in repetition of scanning operations can be reduced by carrying out the whole area scanning in such a manner that the dose of the focused ion beam is locally varied, since the local area scanning can be omitted. FIG. 12A shows a case where the whole area scanning is carried out in such a manner that the scanning density is locally varied. In a local area where the scanning density is made large, the dose of the focused ion beam is increased, and thus the etching depth is also increased. When the above-mentioned whole area scanning is repeated, the step-like portions are moved to the left and right, respectively, as in the example of FIG. 9, and will have a smoothly curved surface. A ratio of the value of a high scanning density to the value of a low scanning density corresponds to the etching depth ratio a:b in the example of FIG. 9.

FIG. 12B shows a case where the whole area is scanned with the focused ion beam in such a manner that the scanning speed of the focused ion beam is locally varied, and this whole area scanning is repeated without carrying out the local area scanning.

Each of FIGS. 13A and 13B shows a case where the whole area is discretely scanned with the focused ion beam in such a manner that the distribution density of ion-irradiated dot or the dwell time of focused ion beam at a dot is locally varied. The methods shown in FIGS. 13A and 13B can be readily carried out by an ion beam etching apparatus of the digital scanning type. It is to be noted that in FIG. 13B, a large black point indicates a long dwell time, and a small black point indicates a short dwell time. In the examples of FIGS. 13A and 13B, the dose of the focused ion beam is increased at both end portions of the whole area. Hence, when the above whole area scanning is repeated, the step-like portion is moved as in the examples of FIGS. 9 and 12A. A ratio of the high distribution density of ion-irradiated dot to the low distribution density thereof, or a ratio of a long dwell time of the focused ion beam at a dot to a short dwell time at a dot corresponds to the etching depth ratio a:b in the example of FIG. 9.

The scan control data 32 which has been explained in the above, is produced by the processor 34, to be supplied to the input device 31.

Prior to the etching operation for a semiconductor device such as a very large scale integration circuit, a positioning operation is performed. In a case where the semiconductor device has an uneven surface, the intensity of the focused ion beam is reduced by the scan controller 27 so that the focused ion beam cannot etch the surface, and then the surface is scanned with the focused ion beam. At this time, the secondary particles emitted from the surface are detected by the secondary particle detector 19, and the scanning ion microscope (SIM) image represented by the distribution of secondary particles is displayed on a display screen by the secondary particle detection controller 28, to determine that portion of the upper wiring conductor 2 which is to be removed, as shown in FIG. 4 and to set the focused ion beam at an appropriate position. While, in a case where the semiconductor surface has a flat surface, a reference mark (for example, a cross shaped mark) formed on the surface is detected with the aid of the secondary particle detector 19. Then, on the basis of data indicating the distance between the reference mark and that portion of the upper wiring conductor 2 which is to be removed (for example, design data indicating the above distance, or distance data obtained by an optical microscope), the stage 21 mounted with the semiconductor device is moved so that the center axis of the focused ion beam falls on the to-be-removed portion of the upper wiring conductor 2.

Thereafter, the intensity of the focused ion beam is increased so that the ion beam can etch the surface. Then, the scan controller 27 and the focusing/blanking controller 26 controls the deflection electrode 18 and the blanking electrode 16 on the basis of the scan control data 32 supplied to the input device 31. That is, as shown in FIG. 7, the whole area having a width of 12 $\mu$m is scanned with the focused ion beam ten times in the first scanning process. Next, local areas each having a width of 3 $\mu$m are scanned with the focused ion beam six times in the second scanning process. Further, the first and second scanning processes are repeated twelve times. Thus, the step-like portions which are formed by the local area scanning, are moved inward progressively by the whole area scanning, as shown in FIGS. 8A to 8F. In other words, even when the upper wiring conductor 2 has undulation as shown in FIG. 4, the first hole 8 reaching the insulating film 3 can be formed by the focused ion beam without leaving the portions 8b of the conductor 2 unetched. That is, the first hole 8 can be formed so that the second hole for cutting the lower wiring conductor 4 is electrically insulated from the upper wiring conductor 2.

Thereafter, the position of the lower wiring conductor 4 is detected on the basis of the design data or by the SIM image. Next, the intensity of the focused ion beam is increased and a narrow scanning area corresponding to the width of the lower wiring conductor 4 is set by the scan controller 27. The narrow scanning area is scanned with the high-intensity ion beam to form the second hole 9 of FIG. 3C, thereby cutting the lower wiring conductor 4. At this time, a conductive material 5 is deposited on the side wall of the second hole 9. However, unlike the state shown in FIG. 3C, the upper wiring conductor 2 is not present at the bottom of the first hole 8, and hence the upper wiring conductor 2 is never shorted to the lower wiring conductor 4.

Next, a method of determining the scan control data 32 will be explained below in detail. That is, the simulation of the cross section of a hole which is formed by ion beam etching, will be explained, with reference to the flow chart of FIG. 18.

Step 1. Inputting of Beam Profile Data

Figure 19A:
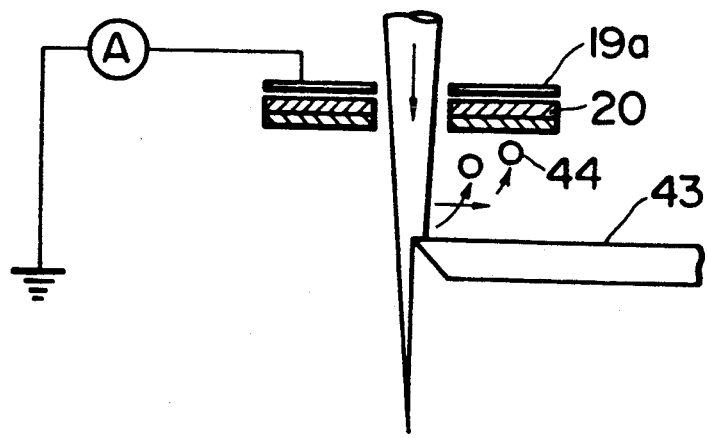
FIGS. 19A to 19C are diagrams for explaining how beam profile data can be obtained.
Figure 19B:
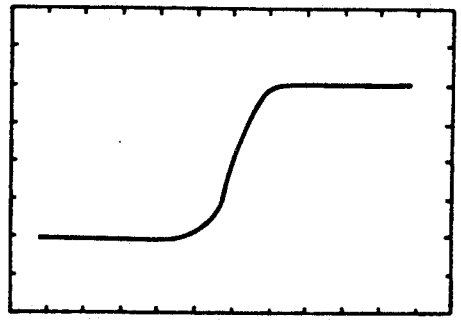
Figure 19C:
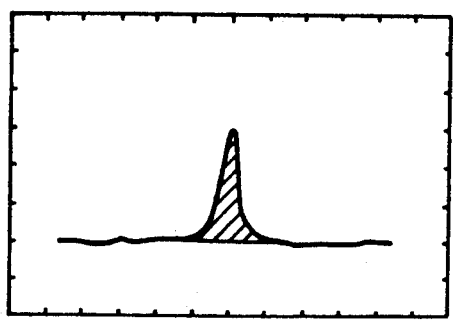

Beam profile data which is obtained by the knife edge method, is written in a simulation program. A beam profile is usually measured by the so-called knife edge method. That is, as shown in FIG. 19A, a focused ion beam is moved so as to traverse the sharp edge of a cleaved silicon surface 43, and secondary particles 44 emitted from the cleaved surface 43 are measured by the secondary particle detection controller 28, to obtain a curve shown in FIG. 19B. The curve of FIG. 19B indicated the integrated value of the ion beam current. Hence, by differentiating this curve, we can obtain ion beam profile data shown in FIG. 19C.

Step 2. Setting of Etching Conditions 47

Etching conditions for obtaining a bottom profile of the hole which corresponds to, for example, the undulation of the upper wiring conductor 2 shown in FIG. 4, are provisionally set. In more detail, the etching conditions such as the width Wa of the whole scanning area, the number Na in repetition of the whole scanning operations performed consecutively in each whole area scanning process, the width Wp of the local scanning area included in the whole scanning area, the number Np in repetition of local area scanning operations performed consecutively in each local area scanning process, the number R indicating how many times the whole area scanning process and the local area scanning process are repeated, alternately and the scanning speed of the focused ion beam are set.

Step 3. Initial Setting

The initial shape of the workpiece is set. In a case where the workpiece has aluminum wiring therein, that region of the workpiece where the aluminum wiring is present, is specified, and a material data table is prepared to use the sputtering rate of aluminum in the above region. Further, the unevenness of the surface of the workpiece based upon the internal structure thereof and the formation of a film is set.

Step 4. Simulation of Ion Beam Irradiation Based upon Data 37 Indicative of Beam Characteristics (Division of Ion Beam Current)

The data 37 on ion beam characteristics is affected by the ion beam profile.

Figure 20:
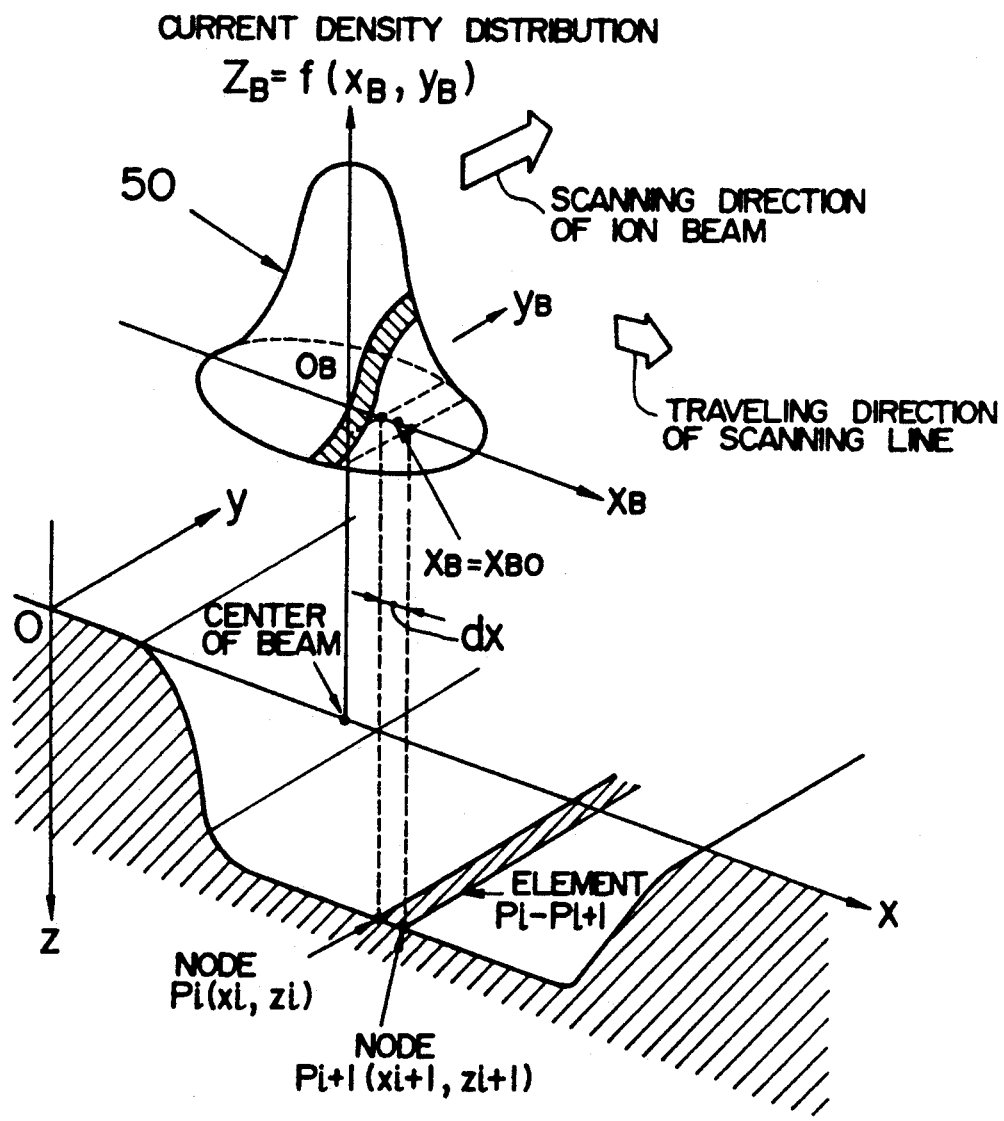
FIG. 20 is a diagram for explaining the simulation of ion beam irradiation (that is, the division of an ion beam).
Figure 21:
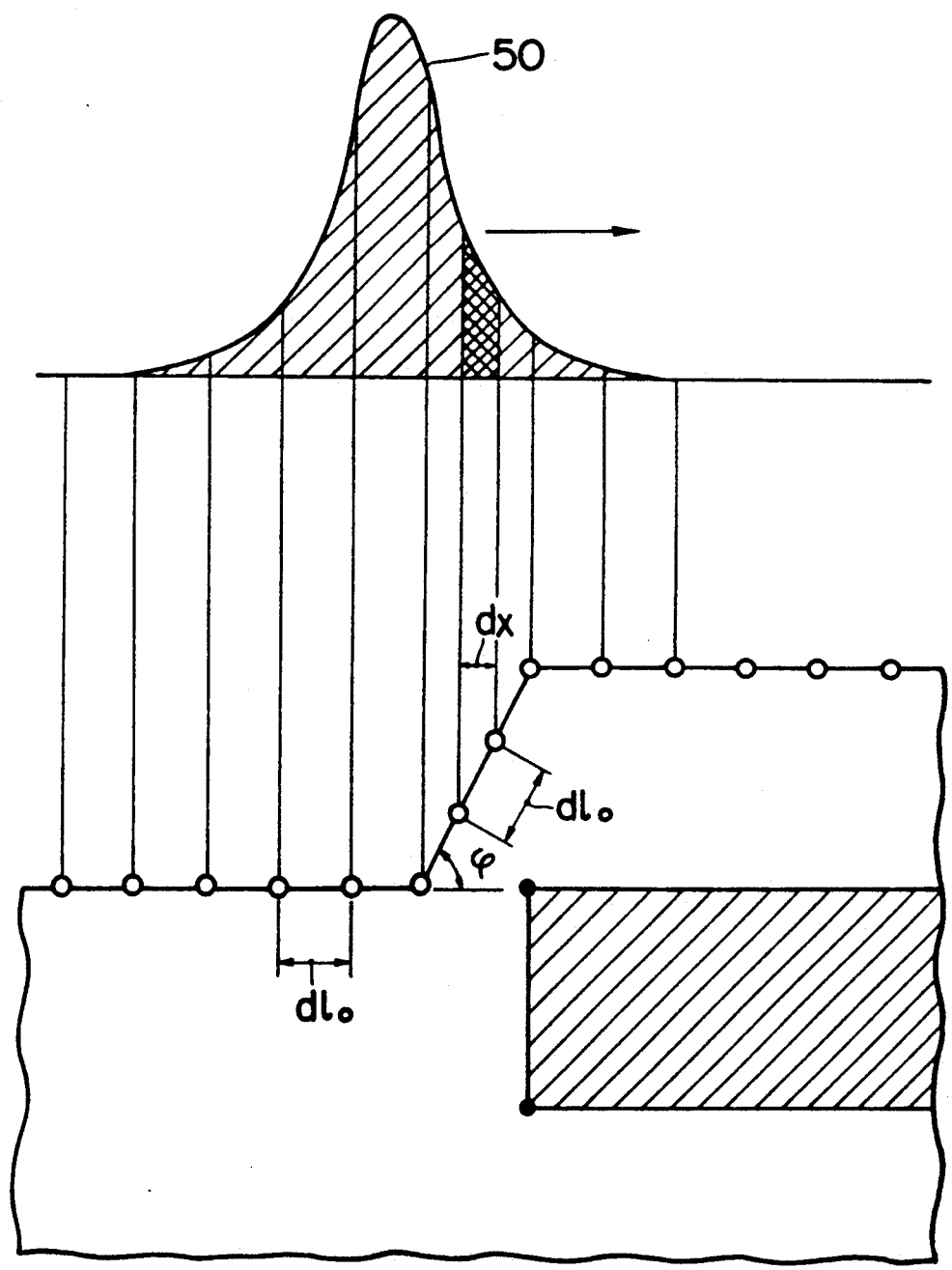
FIG. 21 shows the beam current density at a surface portion having a difference in level.

The simulation of ion beam irradiation based upon beam characteristics will first be explained, with reference to FIGS. 20 and 21. That is, the division of the ion beam current will be explained.

Prior to the division of ion beam current, the coordinate system used will be explained. FIG. 20 shows the coordinate system used for the simulation. Referring to FIG. 20, the scanning direction of the ion beam is indicated by a Y-direction, and a direction perpendicular to a scanning line is indicated by an X-direction. As shown in FIG. 20, the ion beam current density distribution (namely, beam profile) $Z_B$ is expressed by a function $f(x_B, y_B)$, and it is assumed that the current density distribution $Z_B$ is given by a Gaussian distribution. Further, the half width of the ion beam profile is used as the diameter of the ion beam. The simulation is carried out on the basis of the string model, and the progress of etching is expressed by the movement of nodes on the profile of the hole. In more detail, the etching action of the ion beam proceeds in a Z-direction, and the simulation is formulated for a case where the etching action in a Z-X plane is observed from the Y-direction. That is, the shape of an exposed surface is expressed by a curve in the Z-X plane, and nodes $P_n$ (where n=1, 2, 3, and so on) are set on the curve. For instance, a current corresponding to that region of the beam profile which is specified by the width dx between adjacent nodes $P_i$ and $P_{i+1}$, is given to an area between the nodes $P_i$ and $P_{i+1}$. In other words, the surface area between the nodes $P_i$ and $P_{i+1}$ is bombarded with ions contained in that region of the ion beam current density distribution $Z_B$ which has the thickness dx, in a unit time. In the step 3 for initial setting, the nodes are allotted so that the distance $dl_o$ between adjacent nodes is constant, as shown in FIG. 21. In a case where nodes are present on a sloping surface, the number of ions contained in the region of the ion beam profile which has a thickness of $dl_o\cos\Psi$, (where $\Psi$ indicates the angle of inclination of the sloping surface). When the simulation exceeds, the distance between adjacent nodes and the inclination of the exposed surface are varied, but the ion beam current is divided on the basis of the alone principle to pursue the etching action of the ion beam.

Step 5. Simulation of Sputtering Process Based upon Sputtering Rate Data 35 (Calculation of Etching Due to Sputtering)

Figure 22:
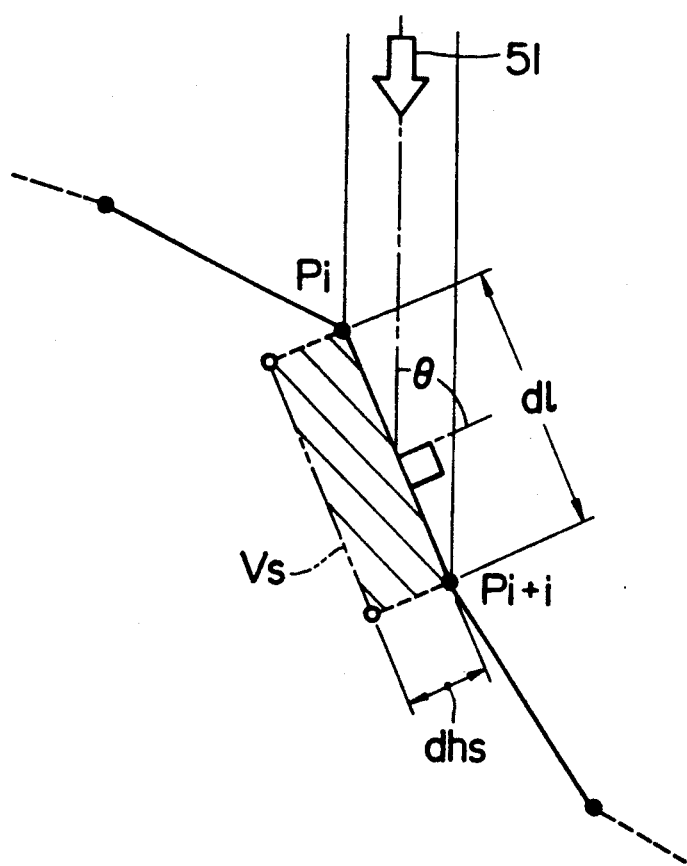
FIG. 22 is a diagram for explaining the calculation of sputtering process.

Now, referring to FIG. 22, let us express the number of ions impinging on the surface area between the nodes $P_i$ and $P_{i+1}$ as $m_1$. The sputtering rate from the workpiece depends upon the angle of incidence of the ion beam, as shown in FIG. 6. Accordingly, when the ion beam impinges on the surface area between the nodes $P_i$ and $P_{i+1}$ at an incident angle $\theta$, the number of ions sputtered from this surface area is given by $n_1 = \eta(\theta) \times m_1$. That is, the volume $V_S$ sputtered from the workpiece is determined from the above number $n_1$. A value which is obtained by dividing the sputtered volume $V_S$ by the distance dl between the nodes $P_i$ and $P_{i+1}$, indicates the amount of movement of the nodes $P_i$ and $P_{i+1}$ as shown in FIG. 22. The above processing is carried out for all the nodes with respect to one scanning line, to determine new positions of the nodes. Thus, the calculation of etching due to sputtering is completed.

Step 6. Simulation of Deposition Process Based upon Data 36 for Deposition Calculation (Calculation of Deposited Layer)

Figure 23:
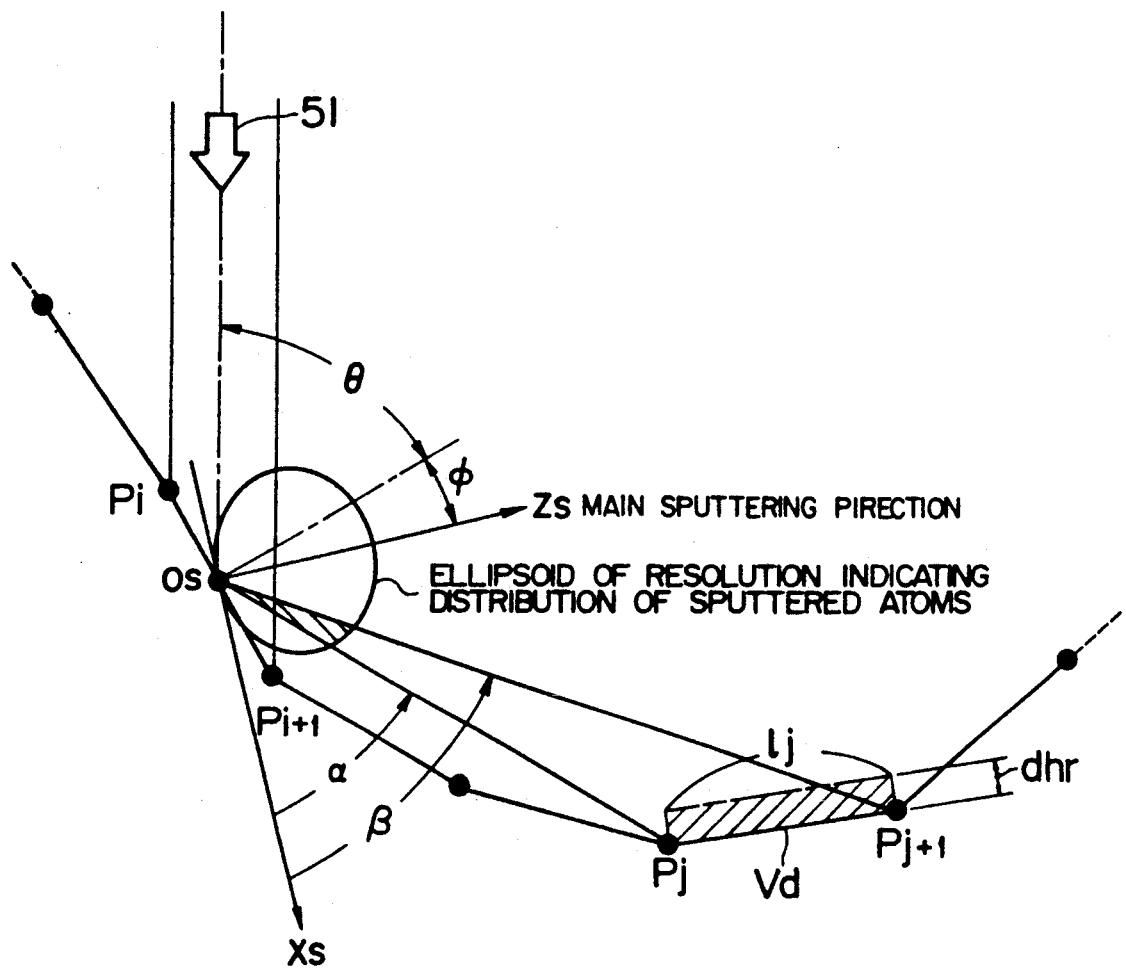
FIG. 23 is a diagram for explaining the calculation of deposition of a sputtered material.

The deposition of a sputtered material will be explained, with reference to FIG. 23. In a case where a workpiece is bombarded with an ion beam to form a hole in the workpiece, a sputtered material is deposited on the wall of the hole. Now, let us suppose that the distribution curve of atoms sputtered from the surface area between the nodes $P_i$ and $P_{i+1}$ has the form of an ellipsoid of revolution with respect to a main sputtering direction $Z_3$ making an angle $\Phi$ with a normal to the surface area, as shown in FIG. 23. In addition to a simulation program for simulating the deposition of the sputtered material, a program for simulating a sputtering process by the Monte-Carlo method is prepared, to previously determine the angle $\Phi$. In FIG. 23, reference symbol $Z_{JS}$ indicates the central sputtering direction, and $X_{JS}$ an axis perpendicular to the direction $Z_{JS}$. The number of atoms which are sputtered from the surface area between the nodes $P_i$ and $P_{i+1}$ toward the surface area between nodes $P_j$ and $P_{j+1}$, can be estimated in the following manner. Now, let us express the center between the nodes $P_i$ and $P_{i+1}$ by $O_{JS}$. Then, the volume of the hatched portion of the ellipsoid of revolution which is included between an angle $\alpha$ and an angle $\beta$ shown in FIG. 23 (namely, angle $\alpha - \beta$) is calculated. The number of atoms deposited on the surface area between the nodes $P_j$ and $P_{j+1}$ is given by the product of the number $m_1$ of atoms sputtered from the surface area between the nodes $P_i$ and $P_{i+1}$ and a ratio of the above-mentioned volume of the ellipsoid of revolution to the whole volume thereof. The amount $dh_r$ of movement of the nodes $P_j$ and $P_{j+1}$ due to the deposition of sputtered atoms is given by dividing a volume $V_d$ corresponding to the number of deposited atoms by the distance $l_j$ between the nodes $P_j$ and $P_{j+1}$.

Step 7. Setting of Shape of Hole

Figure 24:
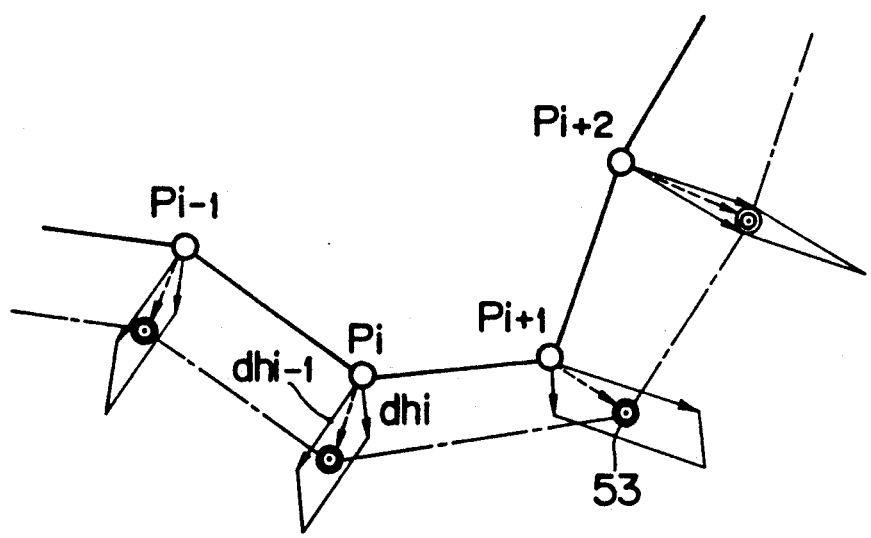
FIG. 24 is a diagram for explaining how nodes move when ion beam etching proceeds.

The amount of movement of node $dh_i = dh_s - dh_r$ is calculated at each node to determine the next position of each node. In the present embodiment, the next position 53 of a node is given by one-half the sum of the movement vector of the node and the movement vector of a node adjacent thereto, as shown in FIG. 24.

Step 8. Check on Coincidence of Shape of Hole with Target Shape

In actual ion beam etching, the whole area scanning and the local area scanning are repeated to form a hole. In simulation, however, the etching depth and the cross section of a hole are calculated each time a scanning operation is performed, and it is checked whether or not the hole has a predetermined depth, after the whole area scanning and the local area scanning have been repeated. When it is judged that the hole does not have the predetermined depth, the whole area scanning is further repeated so that the hole has the predetermined depth.

In a case where the cross section of a hole which is formed by repeating the whole area scanning as above, does not have the target shape, the ratio of the number of whole area scanning operations to the number of local area scanning operations, that is, one of the etching conditions 47 is altered, and the above simulation is carried out. This processing is repeated till the cross section of the hole has the target shape.

Step 9. Determination of Dose

The dose of ion beam at each point in a predetermined scanning area for a case where a hole having the target shape is obtained by simulation, is used as the dose of ion beam for forming the hole actually (that is, scan control data 32), and is sent to the input device 31. Thus, the simulation process is completed, and the simulation for the next hole is started.

As has been explained in the above, according to the present embodiment, in a case where a hole is formed so that the bottom of the hole is formed with a step-like portion, a smoothly curved step-like portion corresponding to the undulation of an upper wiring conductor can be formed at the bottom of the hole. Hence, the above-mentioned shorting between the upper wiring conductor and a lower wiring conductor can be prevented, and thus the manufacturing yield in the wiring process of large scale integration circuits having multi-layered wiring can be improved.

Now, a method of determining the integrated dose of ions will be explained. Prior to ion beam etching, a ratio $R_1$ of a beam current $I_P$ given to the workpiece to a beam current $I_B$ which is given to the blanking aperture 17 by deflecting the ion beam with the aid of the blanking electrode 16, is measured. In an ion beam etching process, the ion beam is deflected at a predetermined interval $S_1$, to measure the beam current $I_B$. The beam current $I_P$ can be calculated by multiplying the measured beam current $I_B$ by the factor $R_1$. By integrating the beam current $I_P$ thus obtained with respect to time, we can obtain an integrated dose of ions. According to this method, even when the ion beam current varies with time, it is possible to follow changes in beam current. When the etching process is terminated immediately after the integrated dose has reached a target dose, an actual dose will be obtained with accuracies of $\pm 5\%$.

Figure 26:
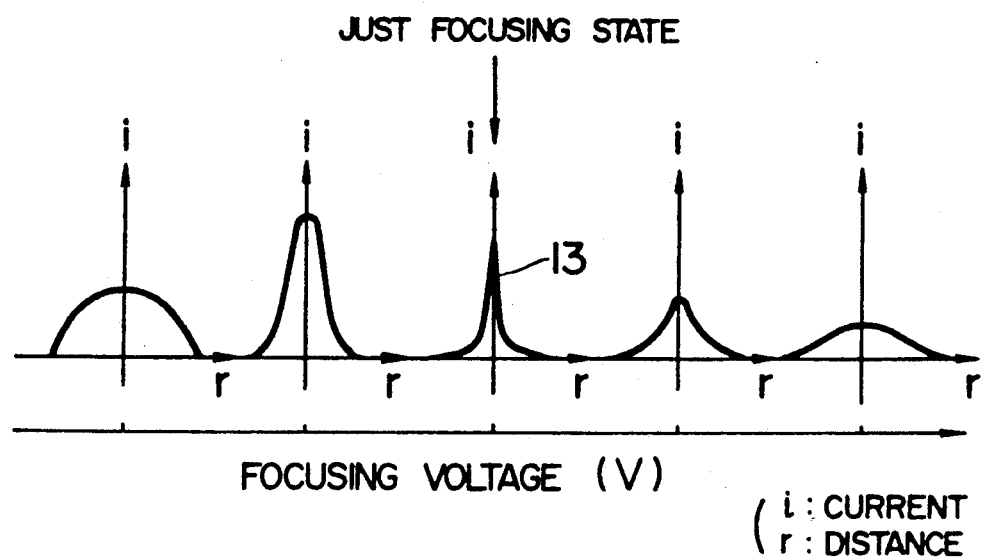
FIG. 26 is a schematic diagram showing how an ion beam profile depends upon a focusing voltage for focusing an ion beam.
Figure 27:
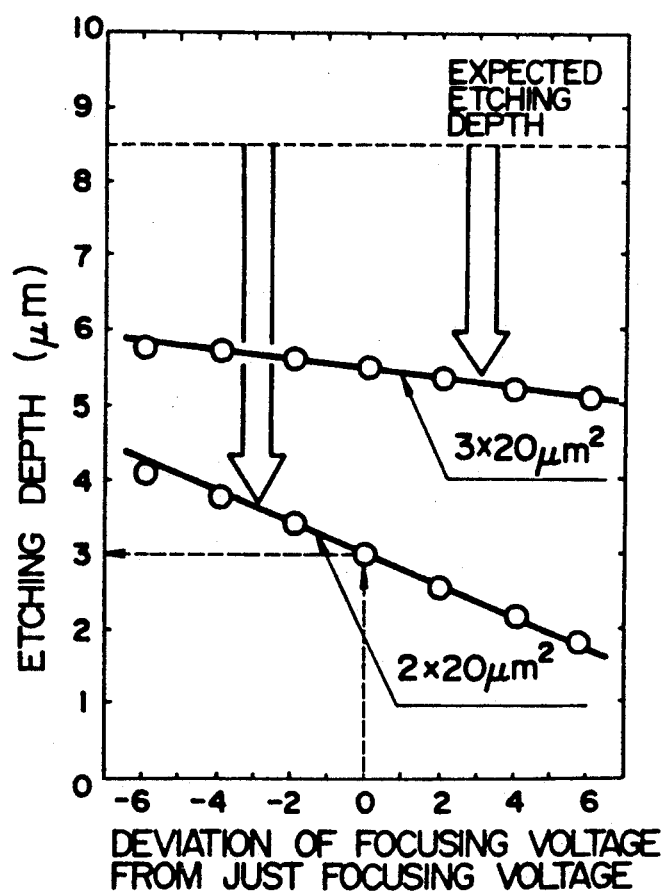
FIG. 27 is a graph showing relations between the deviation of a focusing voltage from a just focusing voltage and a change in etching depth.

In a case where a hole is formed in a semiconductor device at high speed by a focused ion beam, the opening of the aperture 40 is made large, and thus a large-current ion beam is formed. In this case, the diameter of the ion beam increases with the increasing in current. In the actual etching process, the diameter of the ion beam (that is, the beam profile 50 of the ion beam) may have a great influence upon the etching depth. Referring to FIGS. 25A and 25B, in a case where the diameter of the ion beam is far smaller than the width $W_1$ of a scanning area, the etching depth is scarcely affected by the beam profile 50, that is, the etching depth $h_1$ at the center of the scanning area due to the ion beam having a small diameter will be substantially equal to the etching depth $H_2$ at the center of the scanning area due to the ion beam having a large diameter, because the integrated dose at the above center can be set with accuracy of $\pm 5\%$. Referring to FIGS. 25C and 25D, in a case where the width $W_2$ of a scanning area approaches to the diameter of the ion beam, the volume etched out by the ion beam having a small diameter is substantially equal to the volume etched out by the ion beam having a large diameter, but the etching depth $H_3$ due to the small-diameter beam is larger than the etching depth $H_4$ due to the large-diameter beam. This is because when the large-diameter beam is used, the etching at the central portion of the scanning area is reduced by an amount corresponding to the tail portion of the beam profile 50. The beam profile can be changed by the focusing voltage applied to the center electrode of the electrostatic lens (namely, ion optical system) 15, as shown in FIG. 26. FIG. 27 shows relations between the deviation of a focusing voltage from the just focusing voltage and the etching depth, for an ion beam having a current value of about 10 nA. The beam profile of this ion beam has a wide tail portion. Accordingly, in a case where a narrow groove having a width of 2 to 3 $\mu$m is formed by the ion beam, the outside of the groove is etched by the tail portion of the ion beam. Thus, the actual etching depth is one-third or one-half the expected etching depth which is obtained by multiplying an etching rate ($\mu m^3/nc$) by an injected dose per unit area ($nc/\mu m^2$). Further, the etching depth is greatly affected by the beam profile. As shown in FIG. 27, a line indicating the variation of the etching depth with the deviation of a focusing voltage from the just focusing voltage, has a gradient of 0.21 $\mu$m/V for a case where a groove having a width of 2 $\mu$m is formed, and has a gradient of 0.06 $\mu$m/V for a case where a groove having a width of 3 $\mu$m is formed. The accuracy of the focusing voltage can be measured by using a scanning ion microscope SIM or knife edge. In a case where the focusing voltage is adjusted by observing an SIM image visually, the focusing voltage can be set with accuracy of $\pm 3$ V. In a case where the focusing voltage is automatically adjusted by the beam profile detection method using the knife edge, the focusing voltage can be set with accuracy of $\pm 1.5$ V. Even when the focusing voltage is automatically adjusted, a variation of $\pm 0.32$ $\mu$m in etching depth will be generated in a case where the groove having a width of 2 $\mu$m is formed, and a variation of $\pm 0.09$ $\mu$m in etching depth will be generated in a case where the groove having a width of 3 $\mu$m is formed. When a groove having a width of 2 $\mu$m and a depth of 7 $\mu$m is formed, a variation of $\pm 0.75$ $\mu$m ($= 0.32 \times 7/3$) in depth will be generated. Usually, an insulating film having a thickness of 1 to 1.5 $\mu$m is formed between upper and lower wiring conductors of a semiconductor device. When the etching depth is set to a depth of 0.5 $\mu$m from the bottom of the upper wiring conductor to cut the upper wiring conductor, there is a fear that the upper wiring conductor is not cut, or the lower wiring conductor is exposed and the upper conductor is shorted to the lower conductor. Thus, the above-mentioned change in etching depth reduces the manufacturing yield.

Next, explanation will be made of another embodiment of a method of etching a semiconductor device by an ion beam in accordance with the present invention, with reference to FIGS. 28 to 40C.

Figure 28:
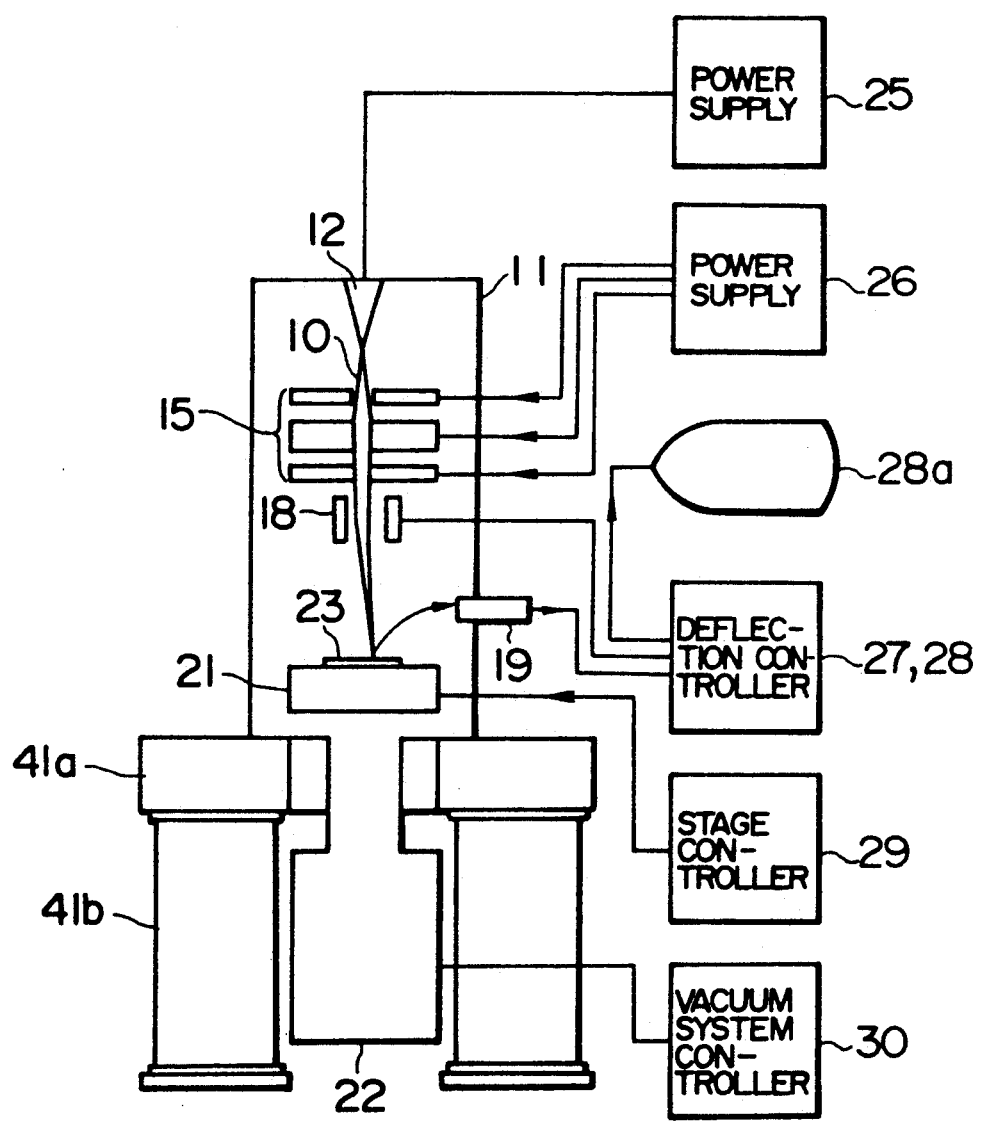
FIG. 28 is a diagram showing main parts of an apparatus for etching a semiconductor device by an ion beam in accordance with the present invention.

FIG. 28 shows main parts of an apparatus for etching a semiconductor device by a focused ion beam (FIB) in accordance with the present invention. Referring to FIG. 28, the ion source 12 for emitting an ion beam 10 is formed of a molten metal ion source to generate an ion current of the order of 1 nA even when the ion beam 10 is focused so as to have a diameter of 1 $\mu$m. The power supply 25 for the ion source applies an ion accelerating voltage and a heating current for melting a metal to be ionized, to the ion source 12. The electrostatic lens 15 is applied with an appropriate voltage from the focusing power supply 26 so that the ion beam 10 is focused on a target (namely, workpiece) 23. Further, the ion beam 10 is deflected by the deflection electrode 18 which is applied with a deflection voltage from the deflection controller 27 and 28. The deflection voltage usually has a saw tooth waveform, to scan a rectangular area on the target 23 with the ion beam 10. Further, when a surface area of the target 23 is bombarded with the ion beam 10, secondary electrons are emitted from the surface area, and the secondary electrons thus obtained are detected by the secondary electron detector 19. An electron beam for performing a scanning operation on the fluorescent screen of a CRT display 28a in synchronism with the scanning operation of the ion beam 10 on the target 23, is intensity modulated in proportion to the signal intensity of the output signal of the secondary electron detector 19. Thus, the state of the surface of the target 23 can be observed. The image displayed on the fluorescent screen of the CRT display 28a is called the scanning ion microscope image (namely, SIM image). The stage 21 for holding the target 23 can be minutely moved by the stage controller 29 so that the image of a predetermined etching position of the target 23 is formed in the field of view of the CRT display 28a. Further, the chamber 11 for containing the members 12, 15, 18, 21 and 23 therein is evacuated by vacuum pump 28 which is controlled by the vacuum system controller 30, to make the pressure inside the chamber 11 less than $1 \times 10^{-6}$ Torr. A base 41a for holding the stage 21 is mounted on an air-servo mount 41b, to cut off the vibration from a floor.

Figure 29:
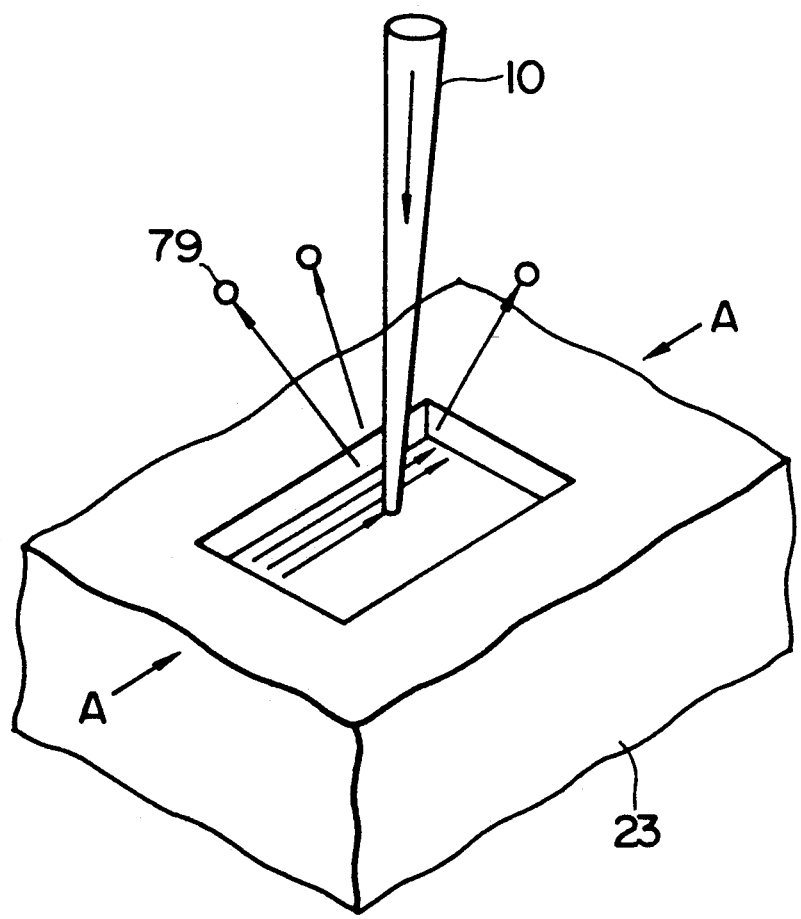
FIG. 29 is a schematic diagram showing how a hole is formed in a target by the apparatus of FIG. 28.
Figure 30A:
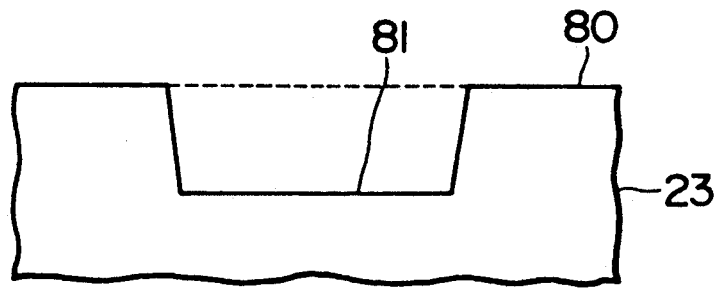
FIGS. 30A to 30C are diagrams for explaining a problem which is to be solved by the present invention.
Figure 30B:
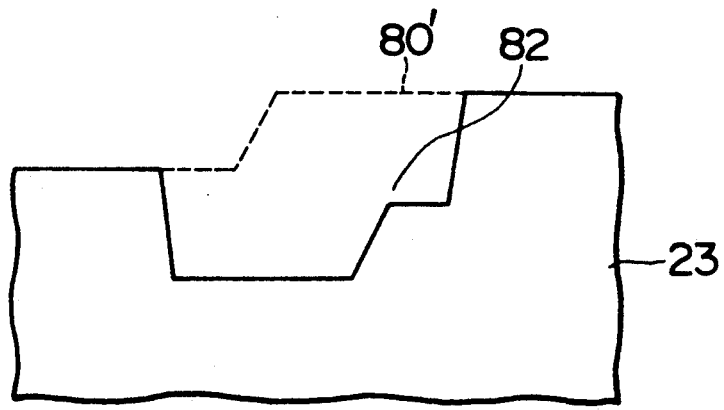
Figure 30C:
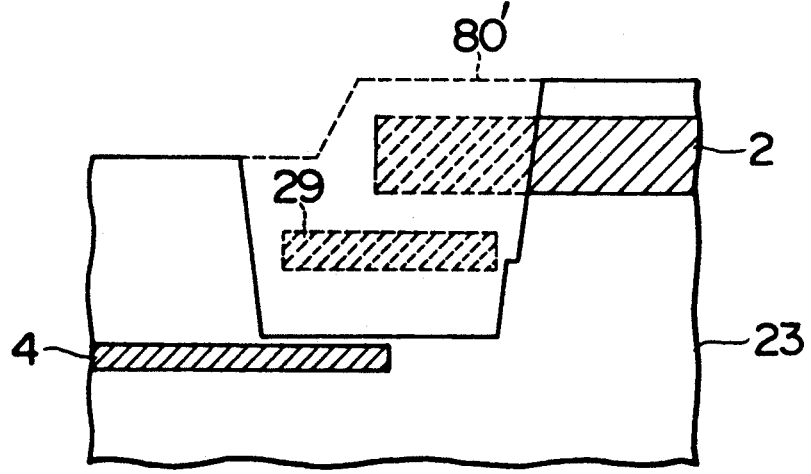
Figure 31A:
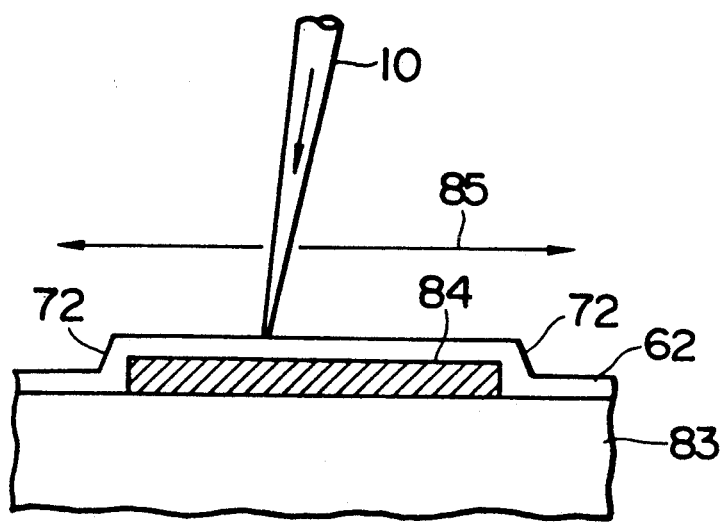
FIGS. 31A and 31B are diagrams for explaining a principle of the present invention.
Figure 31B:
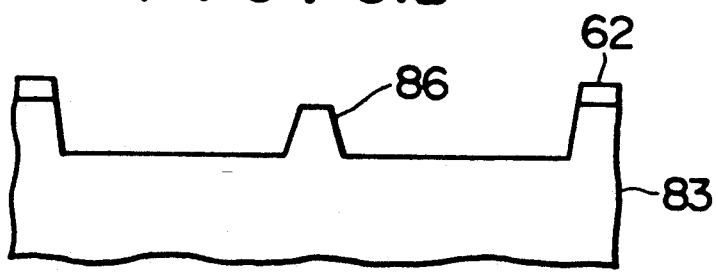

In a case when a predetermined region of the target 23 is etched by the FIB etching apparatus, the predetermined region is scanned by the ion beam 10 as shown in FIG. 29, to sputter atoms 79 from the target 23. In a case where the surface 80 of the target 23 is flat, the bottom of the hole formed by ion beam etching is flat as shown in FIG. 30A. It is to be noted that the cross sections shown in FIGS. 30A to 30C correspond to the cross section taken along the line A—A of FIG. 29. In a case where, as shown in FIG. 30B, the surface 80' of the target 23 has a step-like portion, the bottom 82 of the hole will be affected in its shape by the step-like portion when it is worked across the portion. Thus, an ion dose capable of forming the hole so that as shown in FIG. 30C, part of the upper wiring conductor 2 is removed, an intermediate wiring conductor 2a is cut, and the lower wiring conductor 4 is not damaged, will be limited in a narrow range. Hence, the manufacturing yield is low. Further, let us consider a case where, as shown in FIG. 31A, aluminum wiring 84 having a large width is formed on a flat silicon substrate 83, and an insulating film 62 is formed on the wiring 84 and substrate 83. In order to cut the aluminum wiring 84 by the conventional method, a wide scanning area 85 is scanned with the ion beam 10. In this case, the step-like portions 72 on both sides of the aluminum wiring 84 have a great influence on the shape of the hole formed by the ion beam etching. That is, when the ion beam etching proceeds, the step-like portions move in inner directions. Thus, as shown in FIG. 31B, a protrusion 86 is formed at a central portion of the scanning area, at a time the etching depth exceeds the bottom of the aluminum wiring 84. Hence, the manufacturing yield in the cutting process is reduced.

Now, explanation will be made of the present embodiment capable of solving the above problems.

Figure 32:
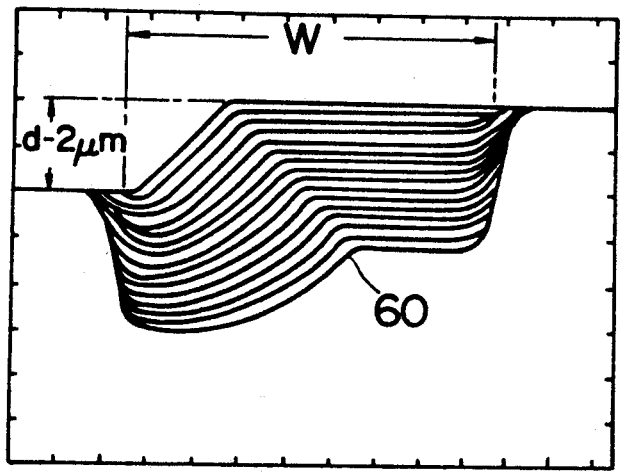
FIG. 32 is a schematic diagram showing changes in cross section of a surface area having a step-like portion, in a case where the whole of the surface area is repeatedly scanned with an ion beam.
Figure 33:
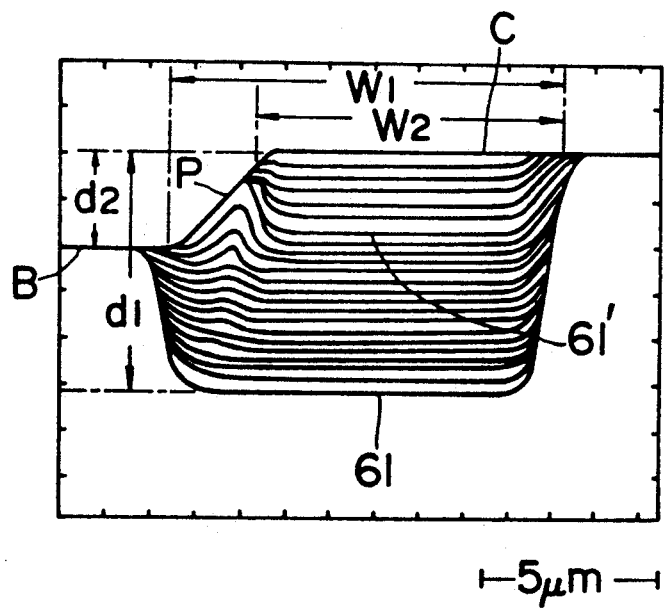
FIG. 33 is a schematic diagram showing changes in cross section of a surface area having a step-like portion, in a case where the high-level region of the step-like portion is first scanned with an ion beam so that the high-level region becomes substantially equal in level to the low-level region, and then the whole of the surface area is scanned with the ion beam.

FIG. 32 shows the progress of ion beam etching in a case where a surface area having a width W and having a step-like portion of 2 μm at one end portion of the surface area, is scanned with an ion beam. As shown in FIG. 32, the bottom 60 of the hole thus formed is formed of an slant face. According to the present embodiment, the ion beam etching is carried out, as shown in FIG. 33. That is, before a surface area having a width $W_1$ is etched by a depth $d_1$, a high-level region C of the step-like portion having a width $W_2$ and a height $d_2$ is scanned with the ion beam so that the high-level region C becomes equal in level to a low-level region B. By this pre-etching, a recess having a bottom 61 is formed and a protrusion P is left at the position of the original step-like portion. Then, the whole of the surface area having the width $W_1$ is scanned with the ion beam. As the ion beam etching proceeds, the wall of the protrusion P is eroded from both sides thereof. Thus, the protrusion P vanishes at the initial stage of this ion beam etching. Thereafter, the area having the width $W_1$ is further etched, while maintaining a flat bottom. Thus, a recess having a total etching depth of $d_1$ and a flat bottom 61 can be formed.

Figure 34:
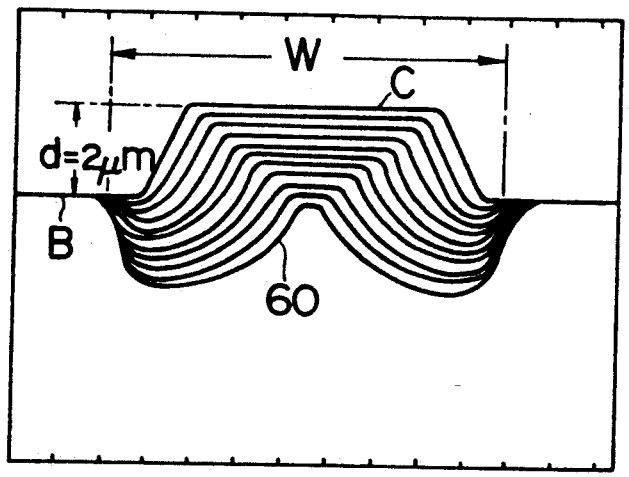
FIG. 34 is a schematic diagram showing changes in cross section of a surface area having parallel step-like portions at both ends thereof, in a case where the whole of the surface area is repeatedly scanned with an ion beam.
Figure 35:
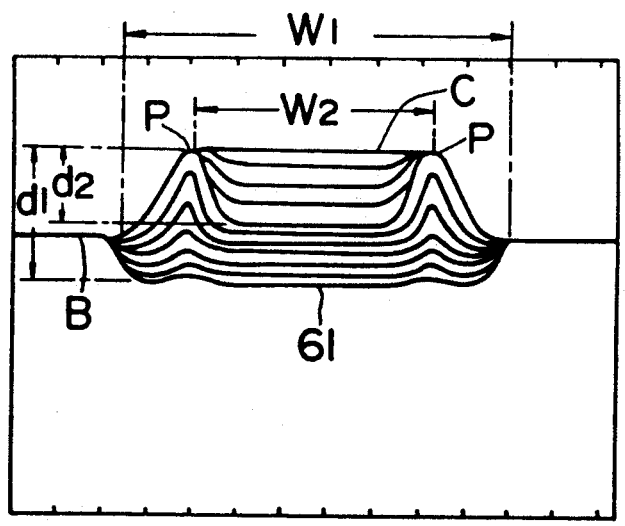
FIG. 35 is a schematic diagram showing changes in cross section of a surface area having parallel step-like portions at both ends thereof, in a case where the high-level region of the step-like portion is first scanned with an ion beam so that the high-level region becomes substantially equal in level to the low-level region, and then the whole of the surface area is scanned with the ion beam.

FIG. 34 shows the progress of on beam etching in a case where a surface area having width W and having step-like portions of 2 μm at both end portions of the surface area, is scanned with an ion beam to cut a wide wiring conductor (not shown) such as the aluminum wiring 84 of FIG. 31A. According to the present embodiment, as shown in FIG. 35, a high-level region C is subjected to pre-etching, and then the whole of a surface area having a width $W_1$ is etched. Thus, a recess having the flat bottom 61 is formed, and the wiring conductor (not shown) can be completely cut. In more detail, the high-level region C having a width $W_2$ is etched to a depth $d_2$ by the pre-etching, so that the level of the high-level region C approaches to the level of a low-level region B. Then, the surface area having the width $W_1$ is etched so that the total etching depth becomes equal to $d_1$.

Figure 37A:
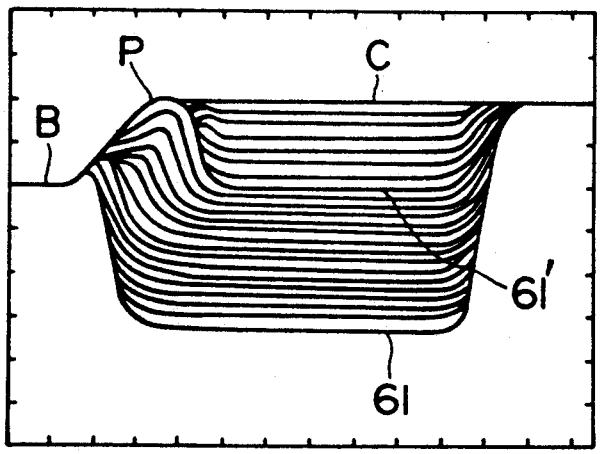
FIGS. 37A to 37C are diagrams each showing changes in cross section of a surface area in a case where the surface area is etched by an ion beam in accordance with the present invention.
Figure 37B:
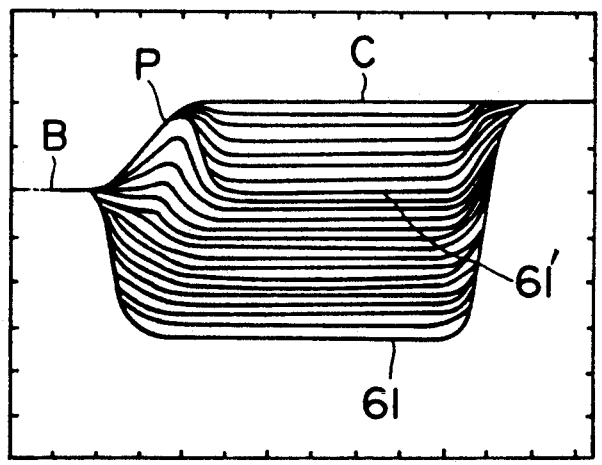
Figure 37C:
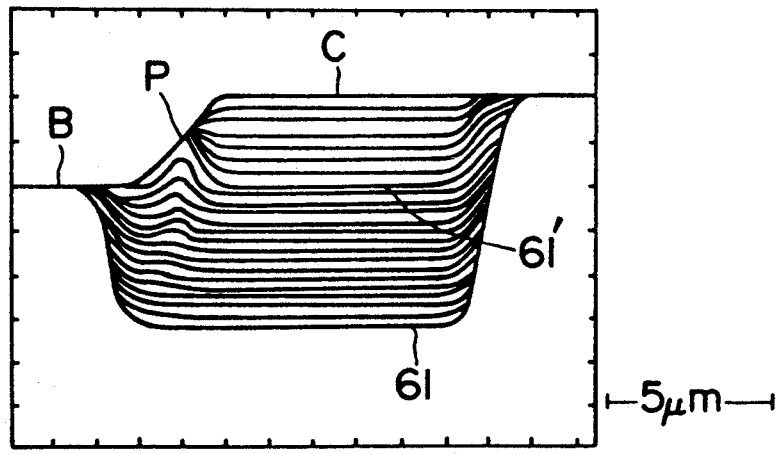

When an actual large scale integration circuit is etched by ion beam etching, an etching position is determined from design data. However, only positional information on a wiring conductor such as aluminum wiring is included in the design data. FIGS. 36A and 36B show, in cross section, a portion of a large scale integration circuit, in which a conductor layer (for example, an aluminum layer 63 formed on an LSI chip 3) is coated with a passivation film 62 made of $SiO_2$ or poly-mide resin. In more detail, FIG. 36A shows a where the passivation film 62 is formed by the chemical vapor deposition method, and FIG. 36B shows a case where the passivation film 62 is formed by sputtering. As shown in FIGS. 36A and 36B, the presence of the aluminum layer 63 reflects as a step-like portion on the surface of the passivation film 62. However, the position of the step-like portion is different in a case where the passivation film 62 is formed by the chemical vapor deposition method, that in a case where the passivation film 62 is formed by sputtering. Further, when the passivation film 62 is formed by sputtering, the position of the step-like portion varies with lot, and moreover fluctuates in a wafer. In more detail, a variation of ±0.5 μm in position of the step-like portion is observed in one wafer. Accordingly, when a pre-etching area of a semiconductor device having the passivation film 62 which is formed by sputtering, is determined on the basis of only the positional information included in the design data, there is a fear that the pre-etching area includes the step-like portion and thus the bottom of the recess formed by pre-etching has a difference in level. Thus, the bottom of the recess formed by main etching may have a step-like portion. In order to solve this problem, the pre-etching area is determined from the design data and the process data indicative of process conditions, under which the passivation film is formed. In other words, the position of the step-like portion is determined with accuracy of ±0.5 μm. Now, let us suppose that the accuracy of automatic positioning of the FIB etching apparatus is ±0.3 μm. Then, the maximum value of the deviation of the step-like portion from one end of the pre-etching area will be ±0.8 μm. FIG. 37B shows a case where the end of the pre-etching area agrees with the step-like portion. While, FIG. 37A shows a case where the end of the pre-etching area deviates from the step-like portion to the left, and FIG. 37C shows a case where the end of the pre-etching deviates from the step-like portion to the right. When a high-level region C is first etched to a depth of 2 μm in the pre-etching process and then the whole area is etched to a depth of 3 μm in the main etching process a recess having a flat bottom can be formed in each of these cases, as shown in FIGS. 37A to 37C. That is, when the pre-etching area is determined from the design data and the process data, and the pre-etching is carried out prior to the main etching, a recess having a flat bottom can be automatically formed. In some cases, however, the process data is not clear, and moreover the position of the step-like portion fluctuates widely. In the above cases, it is necessary to previously find the position of the step-like portion on the passivation film, for example, by observing the SIM image of the passivation film.

Figure 38A:
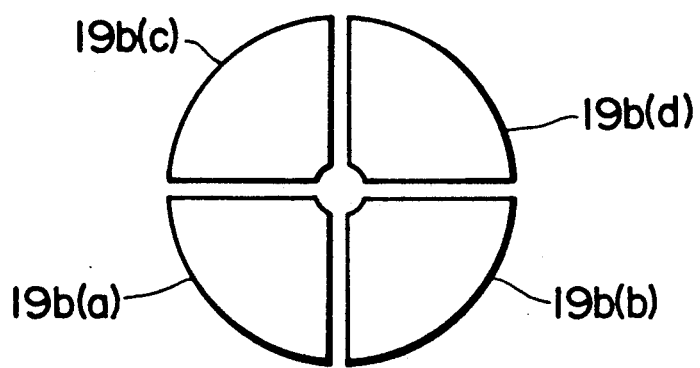
FIG. 38A is a plan view showing split detection plates of a secondary particle detector.
Figure 38B:
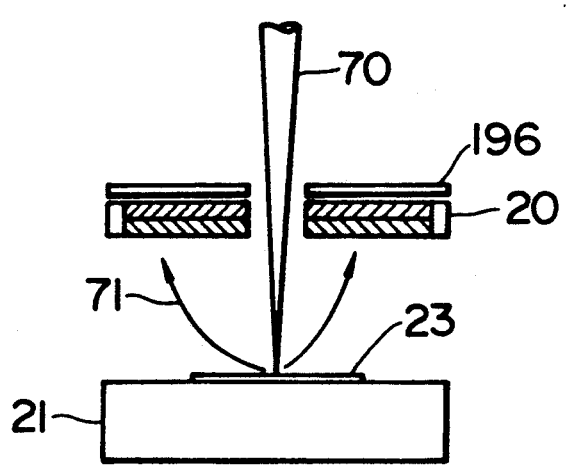
FIG. 38B is a diagram showing a secondary particle detector for detecting secondary particles which are emitted from a specimen.
Figure 39:
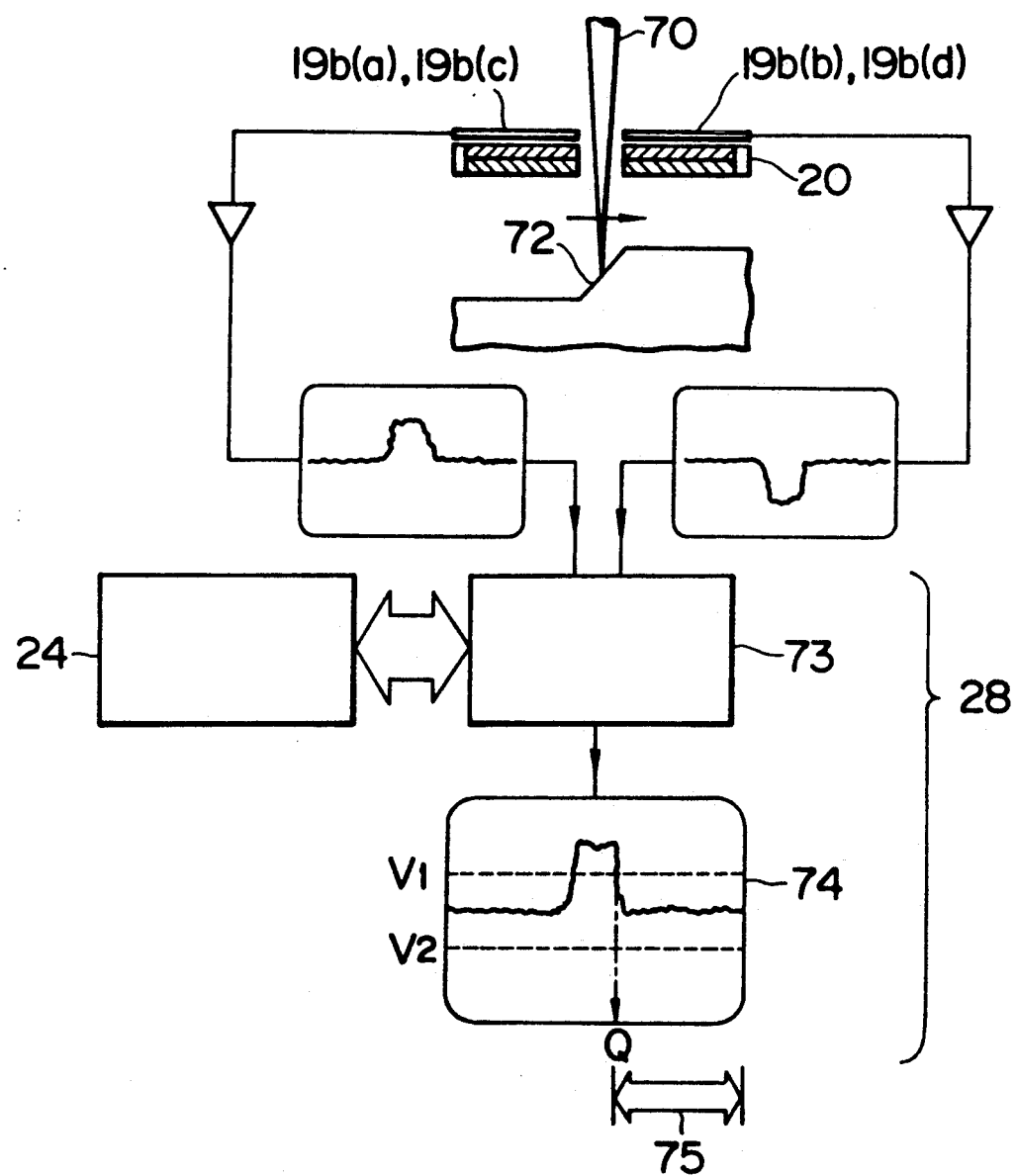
FIG. 39 is a schematic diagram showing an example of position detection means for determining the position of a region having a difference in level, by using the split detection plates of FIG. 38A.
Figure 40A:
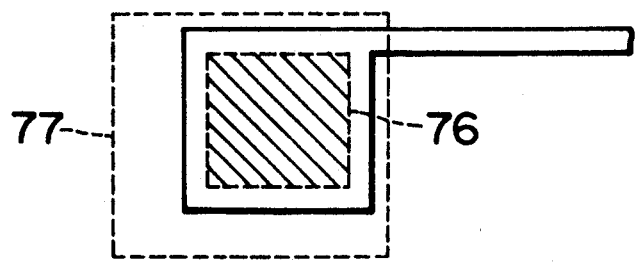
FIGS. 40A to 40C show areas which are scanned by an ion beam to etch various upper wiring patterns included in semiconductor devices.
Figure 40B:
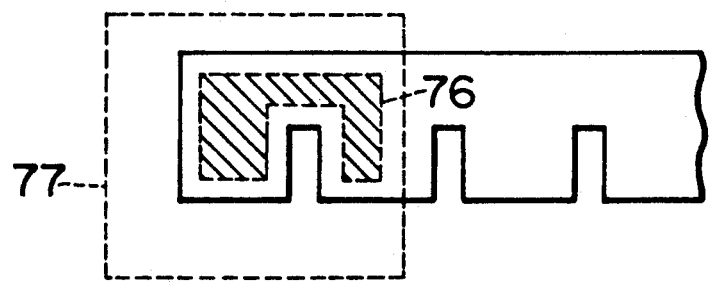
Figure 40C:
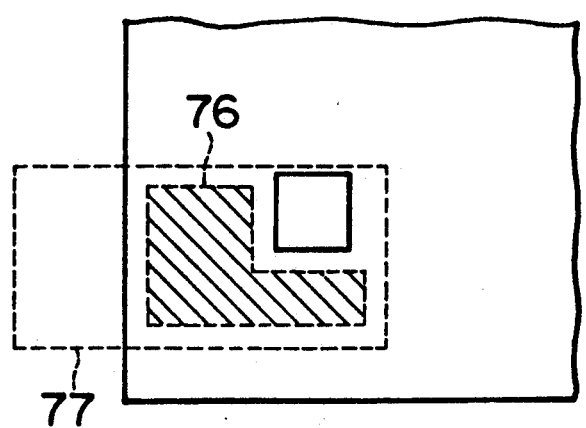

As has been already explained, an SIM image can be obtained by scanning a target with a focused ion beam and by detecting secondary electrons emitted from the target. The SIM image thus obtained can express the unevenness of the surface of the target. That is, a step-like configuration at the passivation film can be observed with the aid of the SIM image. The pre-etching area is determined in the following manner. A scanning area is determined on the basis of design data with accuracy of ±0.3 μm, and a high-level region is detected from the SIM image of the scanning area. Then, the pre-etching area is determined for the high-level region so that the pre-etching area does not include the step-like portion. However, it is impossible to detect the high level region by an ordinary secondary electron detector 19b which is provided with a micro channel plate 20 as shown in FIG. 38B, since the SIM image of the step like portion has the same brightness independently of the direction of inclination of the step-like portion. In order to solve this problem, the detection plate 19b for detecting the amplified signal from the micro channel plate 20 is divided into four parts 19b(a), 19b(b), 19b(c) and 19b(d), as shown in FIG. 38A, and the output currents from four split detection plates 19b(a) to 19b(d) are used to check whether a region of the scanning area is the high-level region or not. A case shown in FIG. 39 will be explained, by way of example. When secondary electrons emitted from a step-like portion 72 are detected by the split detection plates 19b(a) and 19b(c), the number of detected secondary electrons is greater than the number of secondary electrons which are emitted a flat region and detected by the above detection plates, since the step-like portion 72 looks toward the detection plates 29b(a) and 19b(c). When secondary electrons emitted from the step-like portion 72 are detected by the detection plates 19b(b) and 19b(d), the number of detected secondary electrons is smaller than the number of secondary electrons which are emitted from a flat region and detected by these detection plates. In view of the above fact, the output signal from the detection plates 19b(a) and 19b(c) and the output signal from the detection plates 19b(b) and 19b(d) are applied to an image processor 73, to obtain the difference between these output signals. Alternatively, one of these output signals, for example, the output signal from the detection plates 19b(a) and 19b(c) is used. Thus, a signal 74 can be obtained. Next, two threshold voltages $V_1$ and $V_2$ are set for the signal 74. When a portion of the signal 74 exceeds the threshold voltage $V_1$, it is judged that the right side of the above portion corresponds to the high-level region. When a portion of the signal 74 has a signal level lower than the threshold voltage $V_2$, it is judged that the left side of the portion corresponds to the high-level region. In the example of FIG. 39, the high-level region is formed on the right side of the step-like portion, and hence, a region 75 on the right side from a point Q where the signal 74 crosses the threshold voltage $V_1$, is judged to be the pre-etching area. In other words, the region 75 corresponds to the area which has the width $W_2$ in FIG. 33. The point Q can be detected by the software included in the image processor 73. Alternatively, the point Q may be detected by sending the signal 74 from the image processor 73 to the main controller 24, and by executing a software program for comparing the signal 74 with the threshold voltage $V_1$, in the main controller 24. Further, in a case where a step-like portion is formed in a direction perpendicular to the drawing, the output signal from the detection plates 19b(a) and 19b(b) and the output signal from the detection plates 19b(c) and 19b(d) are used to determine the pre-etching area. The above method for determining the pre-etching area, includes a step of supplying the image processor with information on an SIM image to detect a level difference region, and a step of executing a software program for determining the pre-etching area. Accordingly, this method requires a processing time. However, the position of the pre-etching area can be more accurately determined, as compared with a case where the pre-etching area is determined from design data and process data, since the positional accuracy of the pre-etching area is determined only by the detection accuracy of the step-like portion.

In the above, explanation has been made of a case where a recess having a flat bottom is formed at a surface area having a simple form. In actual semiconductor devices, it is required to etch complicated patterns shown in FIGS. 40A to 40C. In these cases, also when hatched areas 76 are subjected to the pre-etching and areas 77 each bounded by a broken border are subjected to the main etching, recesses each having a flat bottom can be readily formed.

Specifically, in semiconductor devices such as a large scale integration circuit, a power line having no undulation is formed as the upper wiring conductor, and it is required to remove a portion of the upper wiring conductor or to form a notch in the upper wiring conductor, for the purpose of etching the lower wiring conductor. In such a case, the present embodiment can exhibit a remarkable effect.

As has been explained in the above, according to the present embodiment, it is possible to solve a problem arising at a time a workpiece having a step-like portion at the surface thereof (for example, a semiconductor device such as a large scale integration circuit, or a magnetic bubble memory device) is etched by ion beam etching, that is, a problem that a recess having a slant bottom is formed, or a protrusion is left on the bottom of a recess. In other words, according to the present embodiment, a recess having a flat bottom can be formed at a surface area having a step-like portion. Thus, a wiring conductor in a semiconductor device can be surely cut or removed by the recess without being disturbed by the slant bottom or the protrusion on the bottom of the recess. In short, no matter what unevenness a surface area may have, a recess having a flat bottom can be formed at also the surface area. Accordingly, when an additional recess is formed at the bottom of the above recess, a recess having a desired shape can be formed, independently of the unevenness of the surface area.

We claim:

1. A method of etching a semiconductor device having a multi-layered wiring including an upper wiring conductor having an undulation, a lower wiring conductor and an insulating film between said upper and lower wiring conductors, by an ion beam, comprising the steps of:

extracting a high-intensity ion beam from a high-intensity ion source to obtain an extracted ion beam;

focusing the extracted ion beam by an ion optical system;

determining target shape data representing a target shape for a first hole to be formed with a curved bottom corresponding to the undulation of said upper wiring conductor in the semiconductor device;

calculating scan control data relating to forming of said first hole having the target shape comprising first scanning by a first scanning process including a whole area scanning by which the focused ion beam scans a whole area substantially corresponding to the first hole and a local area scanning by which the focused ion beam scans partially said whole area, wherein the scan control data is based on said target shape data, an ion incident angle effect on ion beam sputtering rate, a redeposition effect on sputtering hole profile and focused ion beam characteristics;

repeating said first scanning process according to said calculated scan control data so as to form said first hole having the target shape with a depth capable of reaching the insulating film formed between said upper and lower wiring conductors and the curved bottom of the first hole comprised only by said insulating film and having a configuration substantially corresponding to the undulation of said upper wiring conductor; and, second scanning a portion of the bottom of said first hole with a second scanning process with said focused ion beam to form a second hole having a narrow width in comparison with said first hole in the insulating film with a depth capable of cutting the lower wiring conductor whereby said upper and lower wiring conductors are prevented from being electrically connected.

2. The method according to claim 1 wherein the dose of the focused ion beam is varied in said whole area scanning relative to that in said local area scanning.

3. The method according to claim 1 wherein one of scanning density and scanning speed of the focused ion beam is varied in said whole area scanning relative to that in said local area scanning.

4. The method according to claim 1 wherein the second scanning comprises preventing the upper and lower wiring conductors from being electrically connected by a sputtered material of the lower wiring conductor by forming the first hole including the curved bottom comprising only the insulating film, the sputtered material being attached to a side wall of the second hole during the forming of the second hole.

5. A method of forming a hole of a predetermined shape at a surface area having a step-like portion on a protective film of a semiconductor device, said method comprising the steps of:

extracting a high-intensity ion beam from a high-intensity ion source to obtain an extracted ion beam;

focusing the extracted ion beam by an ion optical system to obtain a focused ion beam;

determining a position of a high-level region (W2) relative to the step-like portion based on at least a scanning ion microscope image of the surface area including the step-like portion obtained from secondary particles produced when scanning the surface of said semiconductor device with the focused ion beam;

pre-etching the high-level region by scanning substantially only the high-level region (W2) excluding said step-like portion with the focused ion beam so that the high-level region becomes substantially equal in level to a low-level region relative to the step-like portion; and, forming said hole having a substantially flat bottom on the semiconductor device by etching said high-level region and said low-level region while removing a remaining convex portion of the step-like portion, which is formed by said pre-etching, based on an ion beam sputtering rate increased in accordance with ion incident angle effect to said remaining convex portion, by scanning a whole region (W1) including said high-level region, said low-level region and said step-like portion of the semiconductor device where said hole is to be formed with the focused ion beam so that a wiring existing under the step-like portion of the protective film can be substantially completely cut.

6. The method according to claim 5 wherein the position of the high-level region is determined on a basis of positional information due to design data of the semiconductor device and information on a manufacturing process for making the semiconductor device in addition to information of the scanning ion microscope image.

7. The method according to claim 5 wherein the position of the high-level region is determined on a basis of positional information due to the design data of the semiconductor device in addition to information of the scanning ion microscope image.

8. A method of etching a semiconductor device having multi-layered wiring including an upper wiring conductor having an undulation, a lower wiring conductor and an insulating film between said upper and lower wiring conductors by an ion beam, comprising the steps of:

extracting a high-intensity ion beam from a high-intensity ion source to obtain an extracted ion beam;

focusing the extracted ion beam by an ion optical system;

determining target shape data representing a target shape of a first hole to be formed with a curved bottom corresponding to the undulation of said upper wiring conductor in the semiconductor device;

calculating scan control data relating to forming of said first hole having the target shape comprising first scanning by a scanning process including a whole area scanning by which the focused ion beam scans a whole area substantially corresponding to the first hole and a local area scanning by which the focused ion beam scans partially said whole area, wherein the scan control data is based on said target shape data, an ion incident angle effect on ion beam sputtering rate, a redeposition effect on sputtered hole profile and focused ion beam characteristics; and, repeating said scanning process according to said calculated scan control data so as to form said first hole having the target shape with a depth capable of reaching the insulating film formed between said upper and lower wiring conductors and the curved bottom of the first hole being formed only by said insulating film and having a configuration substantially corresponding to the undulation of said upper wiring conductor.

9. The method according to claim 8 wherein said whole area scanning and said local area scanning are carried out by varying the dose of the focused ion beam in respective scannings relatively with each other.

10. The method according to claim 8 wherein said whole area scanning and said local area scanning are carried out by varying one of scanning density and scanning speed of the focused ion beam in the respective scannings relatively with each other.

* * * * *